(12) United States Patent
Millendorf et al.

(10) Patent No.: US 8,493,109 B2
(45) Date of Patent: Jul. 23, 2013

(54) SYSTEM AND METHOD TO CONTROL A POWER ON RESET SIGNAL

(75) Inventors: Steven M. Millendorf, San Diego, CA (US); Michael K. Batenburg, San Diego, CA (US); Sarath Chandra Kasarla, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 185 days.

(21) Appl. No.: 12/752,027

(22) Filed: Mar. 31, 2010

(65) Prior Publication Data

US 2011/0241741 A1 Oct. 6, 2011

(51) Int. Cl.
*H03L 7/00* (2006.01)

(52) U.S. Cl.
USPC .............................. 327/143; 327/142; 327/198

(58) Field of Classification Search
USPC .......................... 327/142, 143, 198; 708/252
See application file for complete search history.

(56) References Cited

U.S. PATENT DOCUMENTS

| | | | |
|---|---|---|---|
| 4,633,107 A | 12/1986 | Norsworthy | |
| 5,159,217 A | 10/1992 | Mortensen et al. | |
| 5,166,545 A | 11/1992 | Harrington | |
| 5,243,233 A | 9/1993 | Cliff | |
| 5,343,085 A | 8/1994 | Fujimoro et al. | |
| 5,442,310 A | 8/1995 | Bazes | |
| 5,510,741 A | 4/1996 | Childs | |
| 5,576,650 A | 11/1996 | Hirotani et al. | |
| 5,606,276 A | 2/1997 | McClintock | |
| 5,644,259 A * | 7/1997 | Shishikura et al. | 327/143 |
| 5,691,659 A | 11/1997 | Riley | |
| 5,739,708 A | 4/1998 | LeWalter | |
| 5,789,953 A * | 8/1998 | Au et al. | 327/116 |
| 5,912,570 A | 6/1999 | Kuusisto | |
| 6,040,722 A | 3/2000 | Lee | |
| 6,173,436 B1 | 1/2001 | Ciccone et al. | |
| 6,278,302 B1 * | 8/2001 | El-Kik | 327/143 |
| 6,407,597 B1 * | 6/2002 | Ishiwaki | 327/142 |
| 6,737,884 B2 | 5/2004 | Shigemasa et al. | |
| 7,015,744 B1 | 3/2006 | Holloway et al. | |
| 7,057,427 B2 | 6/2006 | Wadhwa et al. | |
| 7,243,117 B2 | 7/2007 | Yamamoto et al. | |
| 7,348,815 B2 | 3/2008 | Chou | |
| 7,362,132 B2 | 4/2008 | Imafuku | |
| 7,378,887 B2 | 5/2008 | Morino et al. | |
| 7,453,295 B2 | 11/2008 | Hotaka | |
| 2006/0153453 A1 | 7/2006 | Thurgood et al. | |
| 2008/0122512 A1 * | 5/2008 | Lin | 327/198 |
| 2009/0267649 A1 | 10/2009 | Saint-Laurent et al. | |

OTHER PUBLICATIONS

International Search Report and Written Opinion—PCT/US2011/030354—ISA/EPO—May 26, 2011.

(Continued)

*Primary Examiner* — Lincoln Donovan
*Assistant Examiner* — Brandon S Cole
(74) *Attorney, Agent, or Firm* — Sam Talpalatsky; Nicholas J. Pauley; Joseph Agusta

(57) ABSTRACT

A system and method to control a power on reset signal is disclosed. In a particular embodiment, a power on reset circuit includes a first linear feedback shift register and a second linear feedback shift register. The first linear feedback shift register is configured to operate at least partially in parallel with the second linear feedback shift register.

42 Claims, 12 Drawing Sheets

OTHER PUBLICATIONS

Xinquan, et al., A Low Quiescent Current and Reset Time Adjustable Power-on Reset Circuit, 6th International Conference on ASIC, 2005, ASICON 2005, IEEE, 4 pages.

Yasuda, et al., "A Power-on Reset Pulse Generator for Low Voltage Applications," The 2001 IEEE International Symposium on Circuits and Systems, 2001. ISCAS 2001, 4 pages.

* cited by examiner

SYSTEM AND METHOD TO CONTROL A POWER ON RESET SIGNAL

I. FIELD

The present disclosure is generally related to controlling a power on reset signal.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

The computing capabilities of a computing device may include the ability to generate a power on reset signal that initializes one or more components of the computing device. The computing device may use analog circuitry to generate and control the power on reset signal. Using analog circuitry in deep submicron technology may result in the power on reset signal being subject to wide timing variances due to process variations. In addition, components used in the analog circuitry, such as capacitors and resistors, consume relatively larger portions of the design area than digital circuitry.

III. SUMMARY

A reset circuit is described that controls a power on reset signal provided to components of a system using digital logic. The reset circuit includes a first linear feedback shift register (LFSR) operating at least partially in parallel with a second linear feedback shift register. Each LFSR may start in a random or pseudo-random state and cycle through a sequence of states until matching a predetermined state. When each LFSR matches its respective predetermined state, a signal is generated that is used to control timing of the power on reset signal.

In a particular embodiment, a power on reset circuit is disclosed that includes a first linear feedback shift register and a second linear feedback shift register. The first linear feedback shift register is configured to operate at least partially in parallel with the second linear feedback shift register.

In a particular embodiment, a method clocks a first linear feedback shift register (LFSR) and a second LFSR to operate substantially in parallel in response to a power-up event. The method includes asserting a completion signal in response to a first state of the first LFSR matching a first predetermined state and a second state of the second LFSR matching a second predetermined state. The method further includes asserting a power on reset signal corresponding to the power-up event, where a timing characteristic of the power on reset signal is based at least in part on the completion signal.

One particular advantage provided by at least one of the disclosed embodiments is that using digital logic, which is not subject to process variations to the same extent as analog circuitry, to generate a power on reset signal enables the system to provide a bounded minimum and maximum reset time. Another particular advantage provided by at least one of the disclosed embodiments is an ability of a system to control timing of a power on reset signal based on multiple LFSRs. Multiple LFSRs may provide redundancy that achieves the same probability of failure as a single larger LFSR. By using multiple LFSR instead of a single larger LFSR, each LFSR operating in parallel may reach a termination condition faster than the single larger LFSR.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 11:
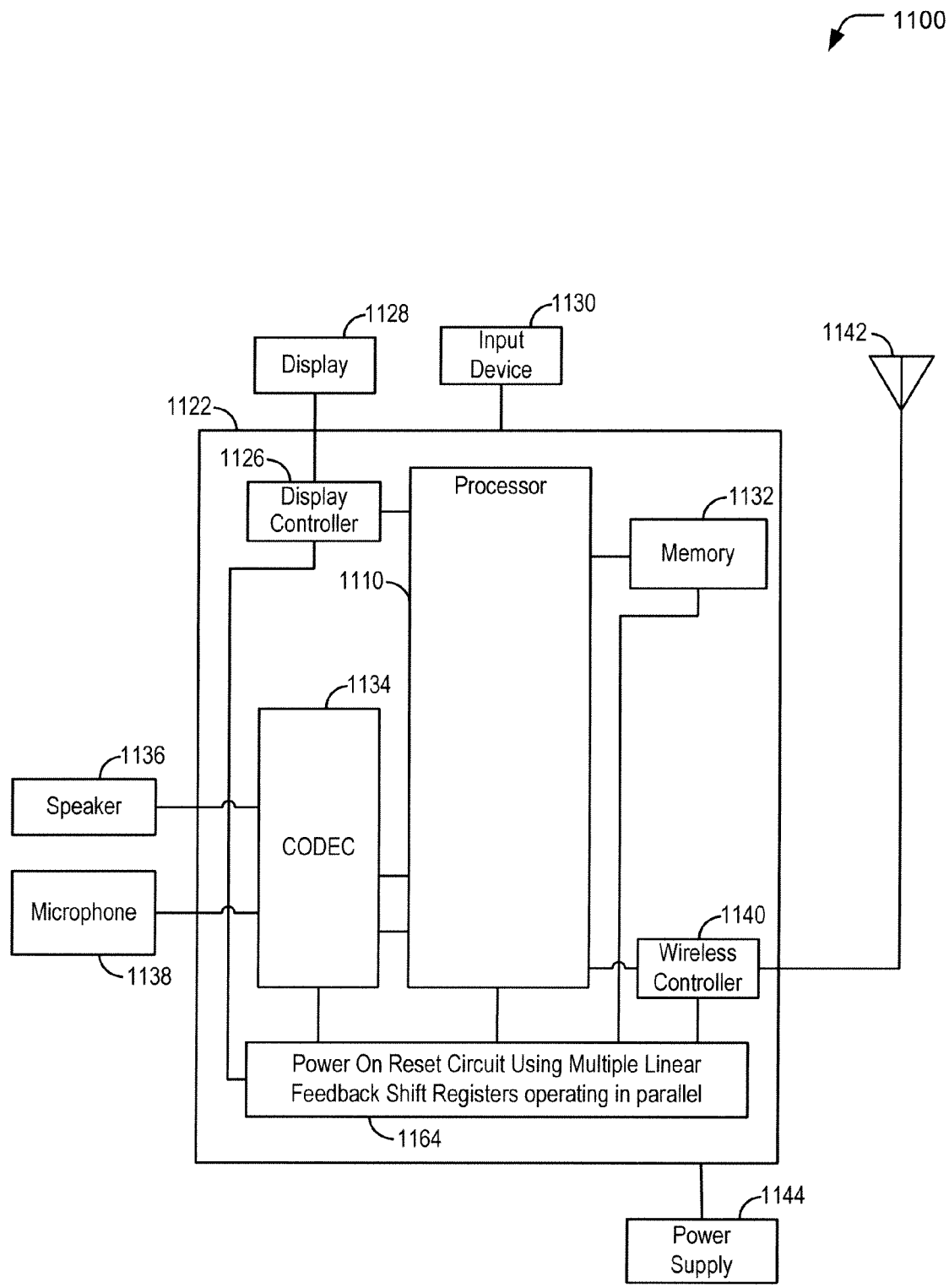
Figure 12:
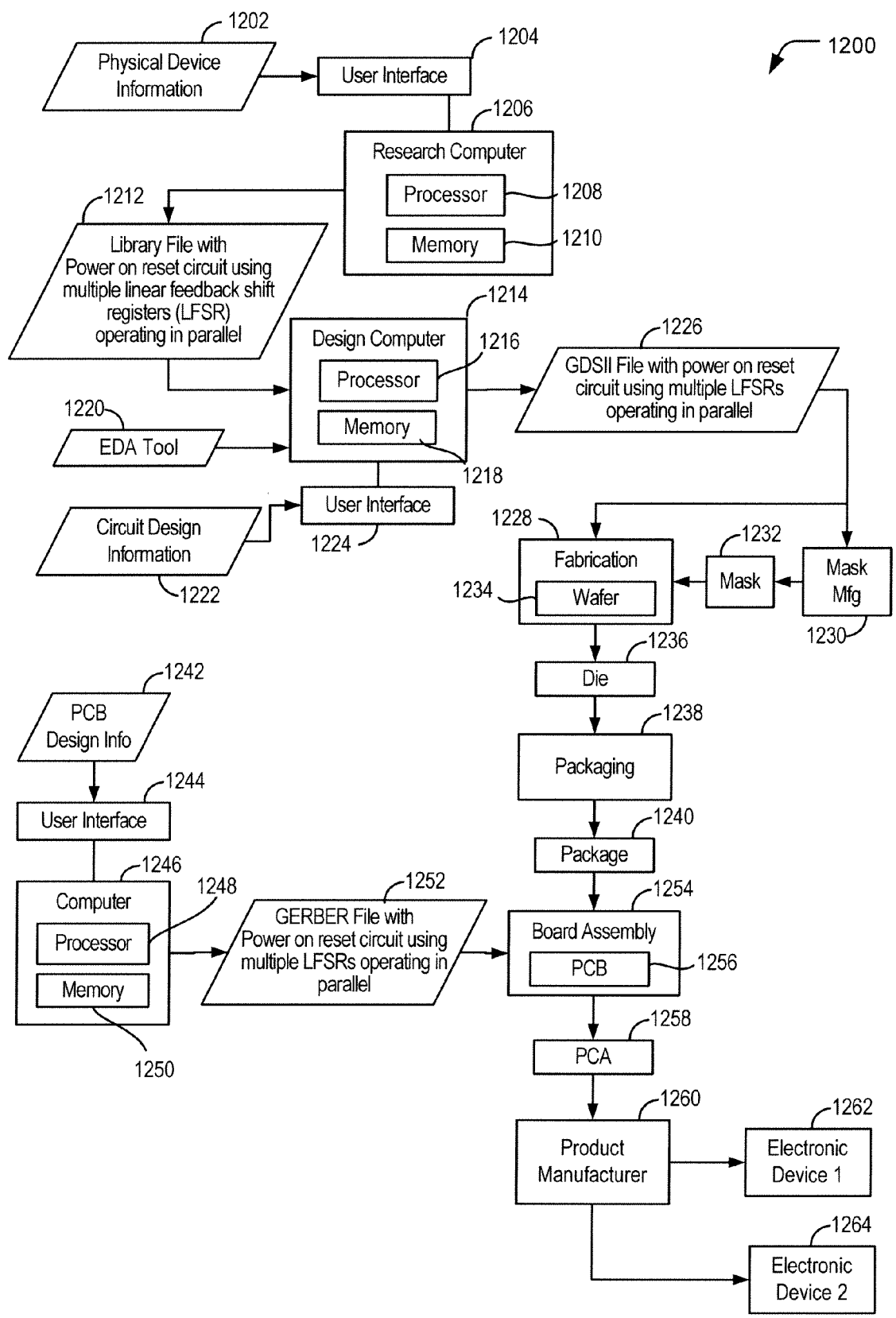

FIG. 11 is a block diagram of a particular embodiment of a wireless communication device that includes a power on reset circuit that uses multiple linear feedback shift registers operating in parallel; and FIG. 12 is a data flow diagram illustrating a manufacturing process for fabricating a device that includes a power on reset circuit that uses multiple linear feedback shift registers operating in parallel.

V. DETAILED DESCRIPTION

Figure 1:
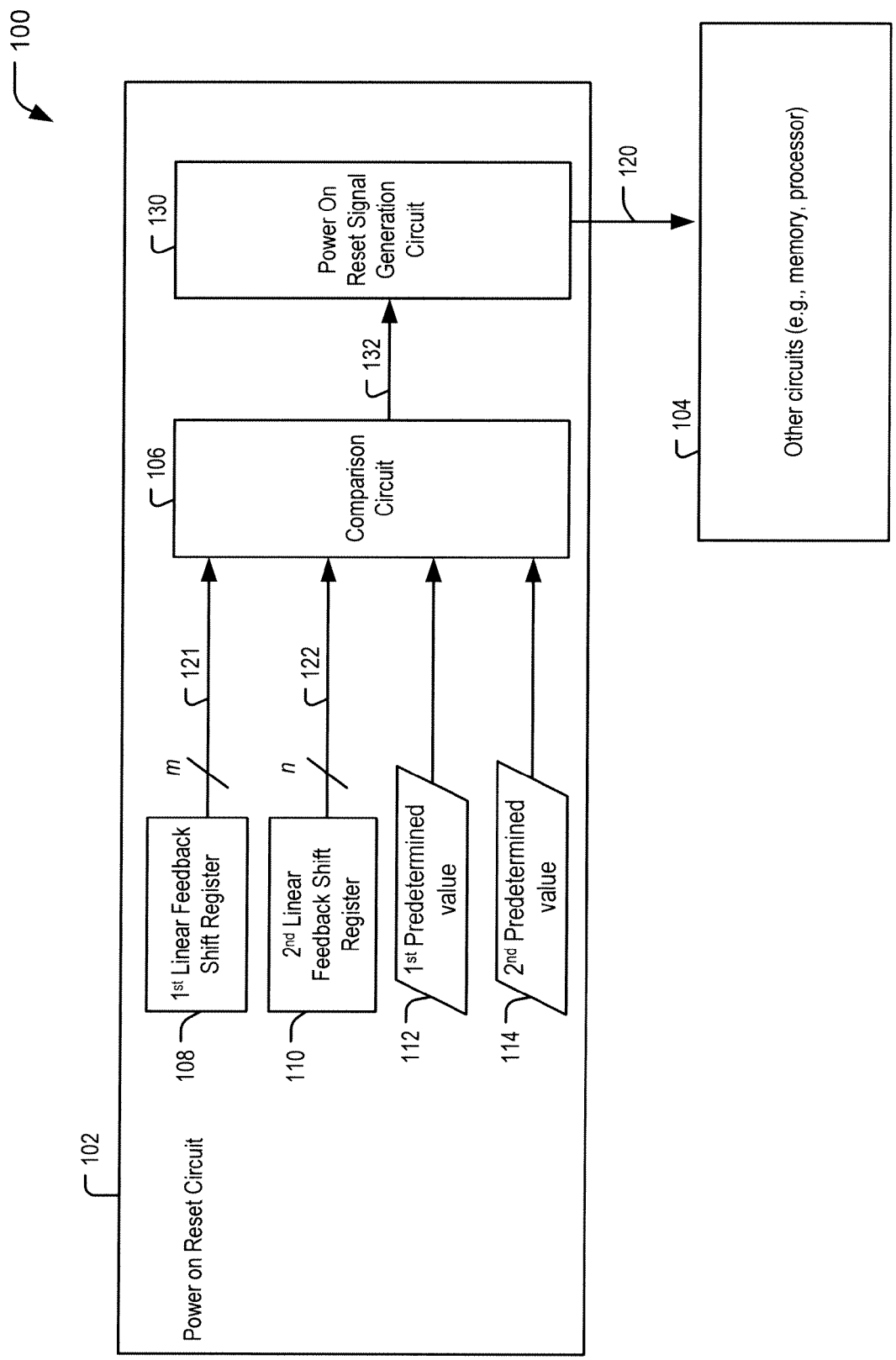
FIG. 1 is a block diagram of a particular illustrative embodiment of a system that includes a power on reset circuit that uses multiple linear feedback shift registers operating in parallel.

Referring to FIG. 1, a first particular illustrative embodiment of a system 100 that includes a power on reset circuit that uses multiple linear feedback shift registers (LFSRs) operating in parallel is shown. The system 100 includes a power on reset circuit 102 comprising a first linear feedback shift register (LFSR) 108 and a second LFSR 110. The power on reset circuit 102 may be configured to determine when values generated by the first linear feedback shift register 108 and the second linear feedback shift register 110 match predetermined values and based on that determination, assert a power on reset signal 120 that is provided to other circuits 104 (e.g., a processor or memory) of the system 100.

Each LFSR 108, 110 is configured to cycle through a sequence of states where each state is determined as a linear function of a prior state. The state of each LFSR 108, 110 is represented by a multi-bit value corresponding to values stored in latching elements of the LFSR, as described further in FIG. 2. For example, a first value 121 of the first LFSR 108 may have m number of bits corresponding to m stages of the first LFSR 108, and a second value 122 of the second LFSR 110 may have n number of bits corresponding to n stages of the second LFSR 110. In general, n and m may be, but are not necessarily, equal. The first LFSR 108 and the second LFSR 110 may each start at a random or pseudo-random state upon power-up and operate substantially in parallel, transitioning from state to state and providing new multi-bit state values (e.g., the first value 121, the second value 122) to a comparison circuit 106 until instructed to stop. For example, the first LFSR 108 and the second LFSR 110 initially operate for a period of time in parallel, although each may stop transitioning at different times.

The comparison circuit 106 may be configured to compare the values 121-122 from the first LFSR 108 and the second LFSR 110 to predetermined values. The predetermined values may be used as a destination or stopping value. For example, a value from a LFSR may begin at a random state of a sequence of states and the predetermined value may indicate a state at which the LFSR is stopped (e.g., prevented from further transitioning). The comparison circuit 106 may be configured to instruct the first LFSR 108 to stop generating new values when a state (represented by the first value 121) of the first LFSR 108 matches the first predetermined value 112. In this case, the second LFSR 110 may continue to generate new values while the first LFSR 108 maintains the value that matches the first predetermined value 112. In a particular embodiment, the second LFSR 110 may stop generating values before the first LFSR 108 stops generating values when the second value 122 matches the second predetermined value 114 before the first value 121 matches the first predetermined value 112. When the comparison circuit 106 determines that the first value 121 matches the first predetermined value 112 and the second value 122 matches the second predetermined value 114, the comparison circuit 106 may assert a completion signal 132.

A power on reset signal generation circuit 130 may be configured to control timing of the power on reset signal 120 in response to receiving the completion signal 132. Asserting the power on reset signal 120 may include transitioning the power on reset signal 120 from a low logic level to a high logic level or vice versa. The power on reset signal 120 may be used to indicate to the other circuits 104 of the system 100 to reset. For example, memory or other storage elements of the system 100 may be initialized in response to detecting the power on reset signal 120 transitioning to or maintaining a high logic level. As another example, the memory may switch from an initializing mode to an operating mode in response to detecting the power on reset signal 120 transitioning to or maintaining a low logic level.

During operation, the first LFSR 108 and the second LFSR 110 enter random or pseudo random states (e.g., the values 121-122) on power-up. Both LFSRs 108, 110 start transitioning through their respective sequences of states in parallel and provide the first value 121 and the second value 122 to the comparison circuit 106. The comparison circuit 106 may compare the outputs (e.g., the first value 121 and the second value 122) of the first LFSR 108 and the second LFSR 110 with predetermined values (e.g., the first predetermined value 112 and the second predetermined value 114). When either value 121 or 122 matches its corresponding predetermined value 112 or 114, respectively, the matching LFSR holds the value while the other LFSR continues transitioning until reaching a predetermined state. When the comparison circuit 106 determines that both the first value 121 and the second value 122 match the first predetermined value 112 and the second predetermined value 114, respectively, the comparison circuit 106 may provide the asserted completion signal 132 to the power on reset signal generation circuit 130. In response, the power on reset signal generation circuit 130 may change the level of the power on reset signal 120 (e.g., from high to low or vice versa) that is provided to the other circuits 104 of the system 100, as described further in reference to FIG. 6. In another embodiment, the power on reset signal generation circuit 130 starts a counter to hold the power on reset signal 120 for a predetermined additional amount of time, as described in FIG. 4.

In a particular embodiment, the probability that the comparison circuit 106 asserts the completion signal 132 during a power-up event is less than a first probability of the first start state matching a first predetermined state and is less than a second probability of the second start state matching a second predetermined state. For example, when the probability that the first LFSR 108 generates a starting value (e.g., the first value 121) that matches the first predetermined value 112 is one out of sixteen and the LFSRs 108, 110 are independent, the probability that the comparison circuit 106 asserts the completion signal 132 during a power up is one out of two hundred and fifty-six. The probability that any particular LFSR matches a predetermined state upon power-up (i.e., a "failure" resulting in a zero delay) may correspond to a number of stages in the LFSR. In a particular embodiment, the probability is $2^n$, where n is the number of stages in the LFSR. However, if the stages in the LFSRs 108, 110 are physically located near one another on a die, then the probability may be less than $2^n$ since the stages of the LFSRs 108, 110 may be more likely to come up to the same values. In a particular embodiment, if each stage starts in a random state and each LFSR 108, 110 has four stages, the probability of the first LFSR 108 generating a value that is the first predetermined value 112 is one out of sixteen, and the probability of both LFSRs 108, 110 each generating the corresponding predetermined value 112, 114 is one out of two hundred and fifty six.

To achieve a probability of failure of one out of two hundred and fifty six with a single LFSR, the value of the LFSR would include eight bits. However, an eight bit LFSR may take a longer duration to reach the predetermined value than the parallel combination of the first LFSR 108 and the second LFSR 110. For example, an eight bit LFSR may generate up to two hundred and fifty five values before generating the predetermined value while a four bit LFSR may be limited to a maximum of fifteen values. In this case, the eight bit LSFR may generate two hundred and fifty five values before completing (i.e., matching the predetermined value) while the four bit LFSR may only generate a maximum of fifteen values before completing. However, the parallel operation of the two four bit LFSRs has the same probability of a matching comparison during a power event as the single eight bit LFSR. Thus, by controlling timing of the power on reset signal 120 based on multiple LFSRs, the power on reset signal 120 may have the same probability of failure as a single LFSR in a smaller completion time.

Figure 2:
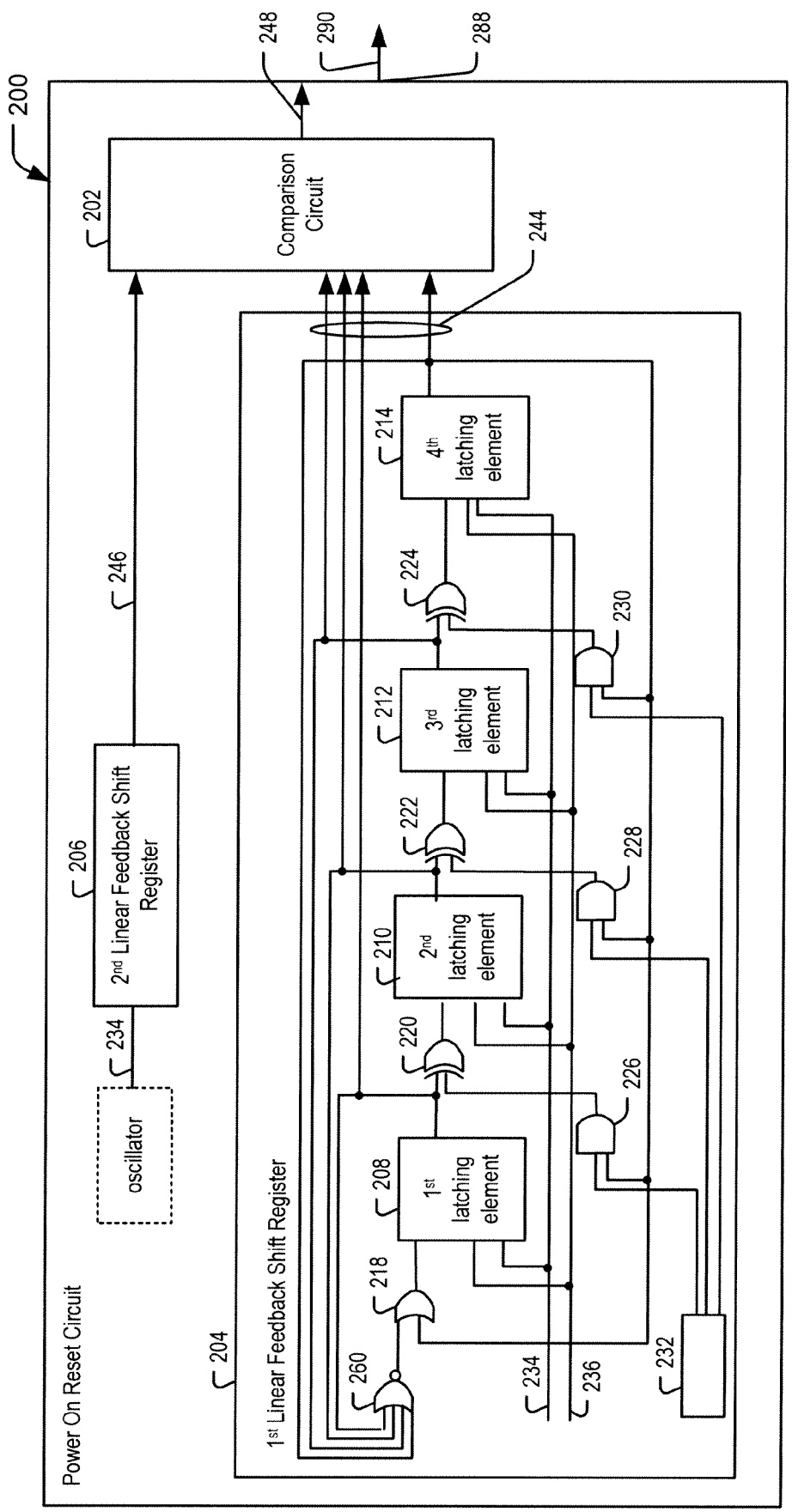
FIG. 2 is a diagram of a particular illustrative embodiment of a power on reset circuit that uses multiple linear feedback shift registers operating in parallel.

Referring to FIG. 2, a first particular illustrative embodiment of a power on reset circuit 200 that controls a power on reset signal based on multiple parallel linear feedback shift registers is shown. The power on reset circuit 200 includes a first representative LFSR 204, a second representative LFSR 206, and a comparison circuit 202. The comparison circuit 202 may be configured to determine whether a first multi-bit value 244 of the first LFSR 204 matches a first predetermined value and whether a second multi-bit value 246 of the second LFSR 206 matches a second predetermined value. In response to determining a match, the comparison circuit 202 may generate a completion signal 248 that is used to control a power on reset signal 290 applied to other components of a system. The power on reset circuit 200 may include an output 288 to selectively provide the power on reset signal 290. The first LFSR 204, the second LFSR 206, and the comparison circuit 202 may correspond, respectively, to the first LFSR 108, the second LFSR 110, and the comparison circuit 106 of FIG. 1.

The first LFSR 204 may include a set of ordered latching elements that includes a first latching element, at least one intermediate latching element, and a last latching element. For example, the first LFSR 204 includes a first latching element, such as a first flip flop 208, a second latching element, such as a second flip flop 210, a third latching element, such as a third flip flop 212, and a fourth latching element, such as a fourth flip flop 214. Each flip flop 208-214 is configured to generate an output in response to receiving a data input and an enable signal 236. An output of each latching element 208-214 is provided to an inverse OR (NOR) circuit 260 which outputs to an input of an OR circuit 218. The other input of the OR circuit 218 receives the output of the fourth flip flop 214.

The first flip flop 208 receives a data input from the OR circuit 218 and receives a clock signal 234 and the enable signal 236. When the enable signal 236 is asserted, the first flip flop 208 is responsive to the clock signal 234 to latch a data value received at its input from the OR circuit 218. The output of the first flip flop 208 is provided to an input of an exclusive-OR (XOR) circuit 220. The other input of the XOR circuit 220 is provided by an output of an AND circuit 226. In this case, the XOR circuit 220 may be a feedback logic circuit that generates an input to the second flip flop 210 based on at least two ordered latching elements (e.g., the output of the fourth flip flop 214 and the output of the first flip flop 208). The AND circuit 226 receives an input from the output of the fourth flip flop 214 and an output from a control circuit 232.

The second flip flop 210 receives a data input from the XOR circuit 220 and receives the clock signal 234 and the enable signal 236. When the enable signal 236 is asserted, the second flip flop 210 is responsive to the clock signal 234 to latch a data value received at its input from the XOR circuit 220. The output of the second flip flop 210 is provided to an input of an XOR circuit 222. The other input of the XOR circuit 222 is provided by an output of an AND circuit 228. The AND circuit 228 receives an input from the output of the fourth flip flop 214 and the output from the control circuit 232.

The third flip flop 212 receives a data input from the XOR circuit 222 and receives the clock signal 234 and the enable signal 236. When the enable signal 236 is asserted, the third flip flop 212 is responsive to the clock signal 234 to latch a data value received at its input from the XOR circuit 222. The output of the third flip flop 212 is provided to an input of an XOR circuit 224. The other input of the XOR circuit 224 is provided by an output of an AND circuit 230. The AND circuit 230 receives an input from the output of the fourth flip flop 214 and the output of the control circuit 232.

The control circuit 232 may include an array of tap bits to control operation of the AND circuits 226-230. The AND circuits 226-230 determine whether each respective flip flop 210-214 receives input based on the fourth flip flop 244 and control a sequence of states that the LFSR cycles through. Although FIG. 2 depicts a configurable LFSR where the output of the control circuit 232 is input to the AND circuits 226-230 that provide input to the XOR circuits 220-224 that provide the input to the flips flops 210-214, in a particular embodiment, the AND circuits 226-230 are not included, XOR gates are only provided as input to flip flops that receive feedback, and the control circuit 232 provides input to the remaining XOR circuits directly.

The first LFSR 204 can be controlled via the control circuit 232 to have a "maximal" length, used herein to denote a sequence of $(2^n)-1$ non-repeating states for a LFSR having n latching elements. In a LFSR having a maximal length, the LFSR will generate a sequence of values that includes every possible state of the LFSR, except one state, before the sequence is repeated. As a result, a LFSR having maximal length will step through the sequence of states from any startup state to reach any terminal state, as long as the starting state and the terminal state are different from the single excluded state. In contrast, a LFSR that is not configured to have maximal length will have a repeating sequence that excludes multiple states. As illustrated, the first LFSR 204 includes additional circuitry (the NOR circuit 260) to enable the first LFSR 204 to transition from an excluded state (the all-0's state excluded from a maximal length sequence) to a state within the sequence (e.g. the "1000" state) in case the first LFSR 204 starts up in the excluded state.

The second LFSR 206 may be clocked using the clock signal 234. For example, the clock signal 234 may be provided via an external signal or generated via an internal oscillator, such as a shift register. Alternatively, the first LFSR 204 and the second LFSR 206 may receive independent clock signals.

During operation, the first LFSR 204 may receive an enable signal 236 that activates the flip flops 208-214. In response to the enable signal 236, the flip flops 208-214 may receive data at each input and generate an output at each clock cycle. In a particular embodiment, the first LFSR 204 may start in a first start state in response to a power-up event and the second LFSR 206 may start in a second start state in response to the power-up event. The first start state may be a first random or pseudo-random state and the second start state may be a second random or pseudo-random state. For example, the first LFSR 204 may generate the first multi-bit value 244 that is compared by the comparison circuit 202 to a predetermined value. When the comparison circuit 202 determines that both the second multi-bit value 246 of the second LFSR 206 and the first multi-bit value 244 of the first LFSR 204 match predetermined values, the comparison circuit 202 may generate the completion signal 248. The completion signal 248 may be used to transition the power on reset signal 290. For example, the power on reset signal 290 may be transitioned from a high logic level to a low logic level when the completion signal 248 indicates a match (or low to high).

Figure 3:
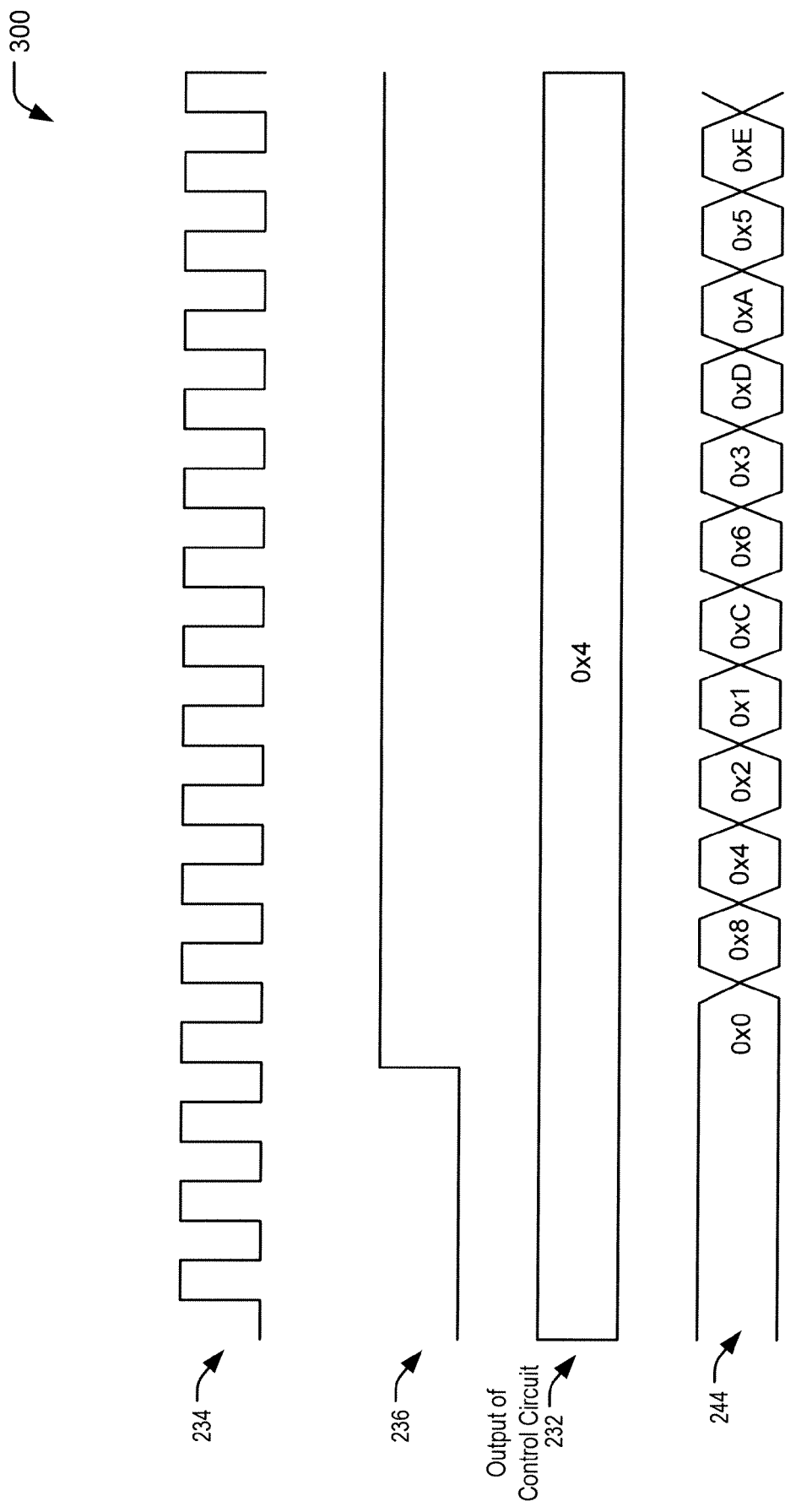
FIG. 3 is a timing diagram illustrating signals of the power on reset circuit of FIG. 2.

Referring to FIG. 3, a timing diagram 300 of the first linear feedback shift register (LFSR) 204 of FIG. 2 is shown. The timing diagram 300 illustrates the clock signal 234 that is applied to each flip flop 208-214 of the first LFSR 204. The timing diagram 300 also illustrates a transition of the enable signal 236 from a low logic level to a high logic level. The first LFSR 204 may generate the first multi-bit value 244 illustrated as "0" while disabled, as an example of a random or pseudo-random starting state. The timing diagram 300 illustrates how, after receiving the high logic level at the enable signal 236, the first multi-bit value 244 changes with respect to the clock signal 234 as the first LFSR 204 transitions from state to state according to the sequence set by the control circuit 232.

As illustrated in the timing diagram 300, the output of the first multi-bit value 244 is a "0" state before the enable signal 236 transitions from a low logic level to a high logic level. The "0" state is denoted as a hexadecimal number (0x0) that corresponds to a binary value of "0000." Each zero bit may correspond to a particular state of an output of the flip flops 208-214 of the first LFSR 204. In this case, the logic zero output of each flip flop is input into the inverted OR circuit 260. The inverted OR circuit 260 generates a logical one output that is input into the OR circuit 218. The other input of the OR circuit 218 is a logic zero output from the fourth flip flop 214. The OR circuit 218 outputs a logic one to the first flip flop 208 to enable the first LFSR 204 to transition out of the 0x0 state.

In response to the enable signal 236 transitioning from a low logic level to a high logic level, as illustrated in the timing diagram 300, the first flip flop 208 may generate a logic one as its output at a subsequent clock cycle. As the inputs of the flips flops 210-214 do not change, the second flip flop 210, the third flip flop 212, and the fourth flip flop 214 may continue to generate a logic zero. In this case, the output of the first multi-bit value 244 may be "1000", which corresponds to the hexadecimal number "8", as illustrated as in the timing diagram 300.

The logic one output of the first flip flop 208 may be input into the inverted OR circuit 260 which generates a logic zero that is provided to the OR circuit 218. The OR circuit 218 generates a logic zero in response to receiving a logic zero from the inverted OR circuit 260 and the output from the fourth flip flop 214. In response, the first flip flop 208 may generate a logic zero in the second state of the sequence. The logic one output of the first flip flop 208 may be input into the XOR circuit 220. The XOR circuit 220 may receive an input from the control circuit 232. As illustrated in the timing diagram 300, the output of the control circuit 232 is a hexadecimal number of "4" which corresponds to an output state of "100." The output state of "100" may be a state that enables the AND gates 226-230 to provide feedback data to the XOR circuits 220-224 to generate values that are provided to the flip flops 210-214. Based on a number of latching elements of a LFSR, the output of the control circuit 232 can be set to configure the LFSR to have a maximal sequence length. In some embodiments, the output of the control circuit 232 may be configurable, based on the number of latching elements. For example, in a four bit LFSR, the greatest number of values may be fifteen values.

The AND circuit 226 receives the logic one of the output state 100 at an input and the AND circuits 228-230 receive the logic zeros of the output state 100, respectively at inputs. The AND circuit 228 generates a logic zero output in response to receiving a logic one input from the control circuit 232 and a logic zero output from the fourth flip flop 214. The XOR circuit 220 generates a logic one in response to receiving a logic zero from the AND circuit 226 and a logic one from the first flip flop 208. In response to receiving a logic one from the XOR circuit 220, the second flip flop 210 generates a logic one as an output in the second state. The third flip flop 212 and the fourth flip 214 may continue to generate a logic zero output in the second state. In this case, the second state of the first multi-bit value 244 may be "0100", which corresponds to a hexadecimal "4", as illustrated in the timing diagram 300.

Figure 4:
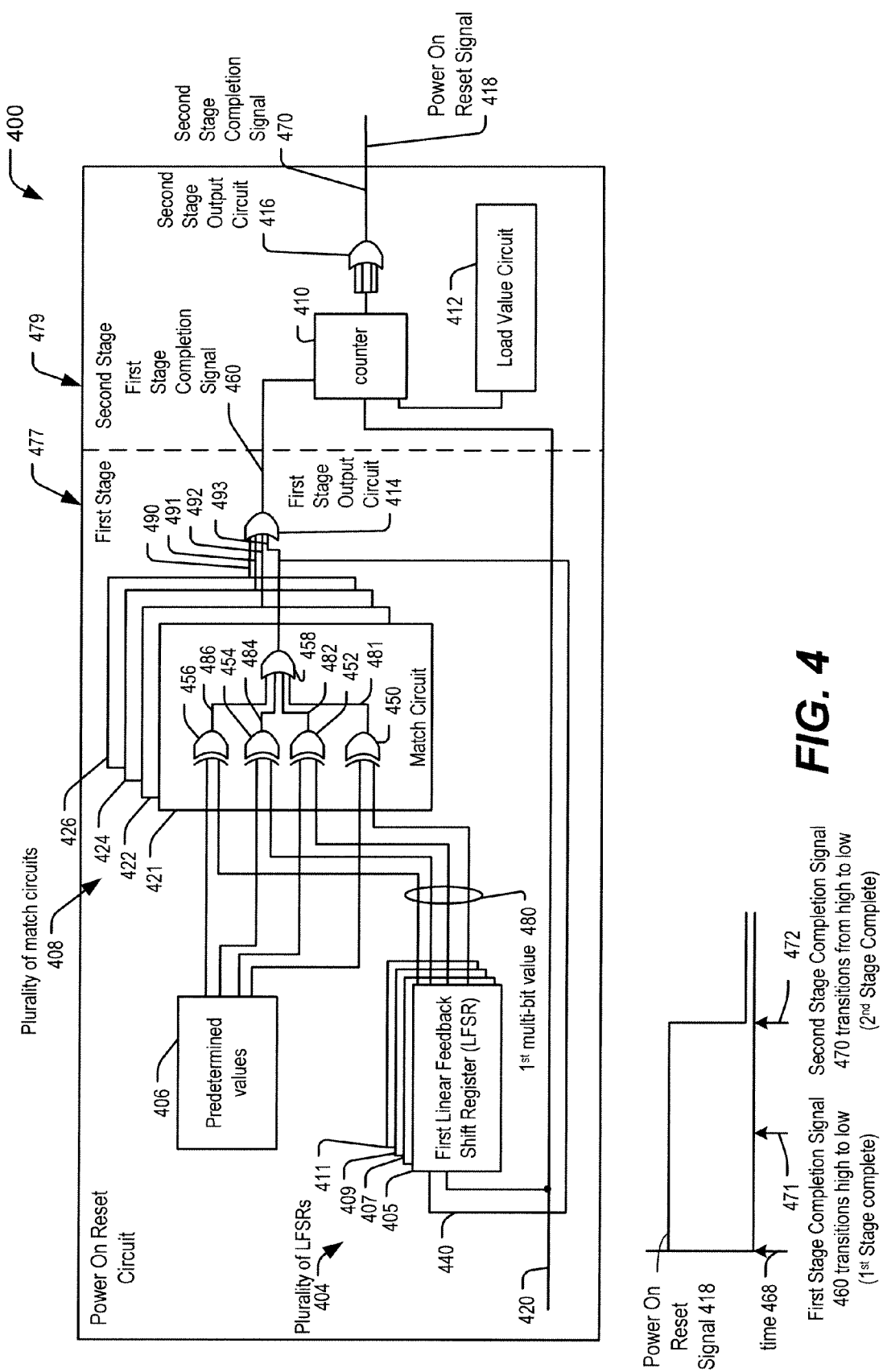
FIG. 4 is a diagram of a particular illustration embodiment of a power on reset circuit that uses multiple linear feedback shift registers operating in parallel.
Figure 5:
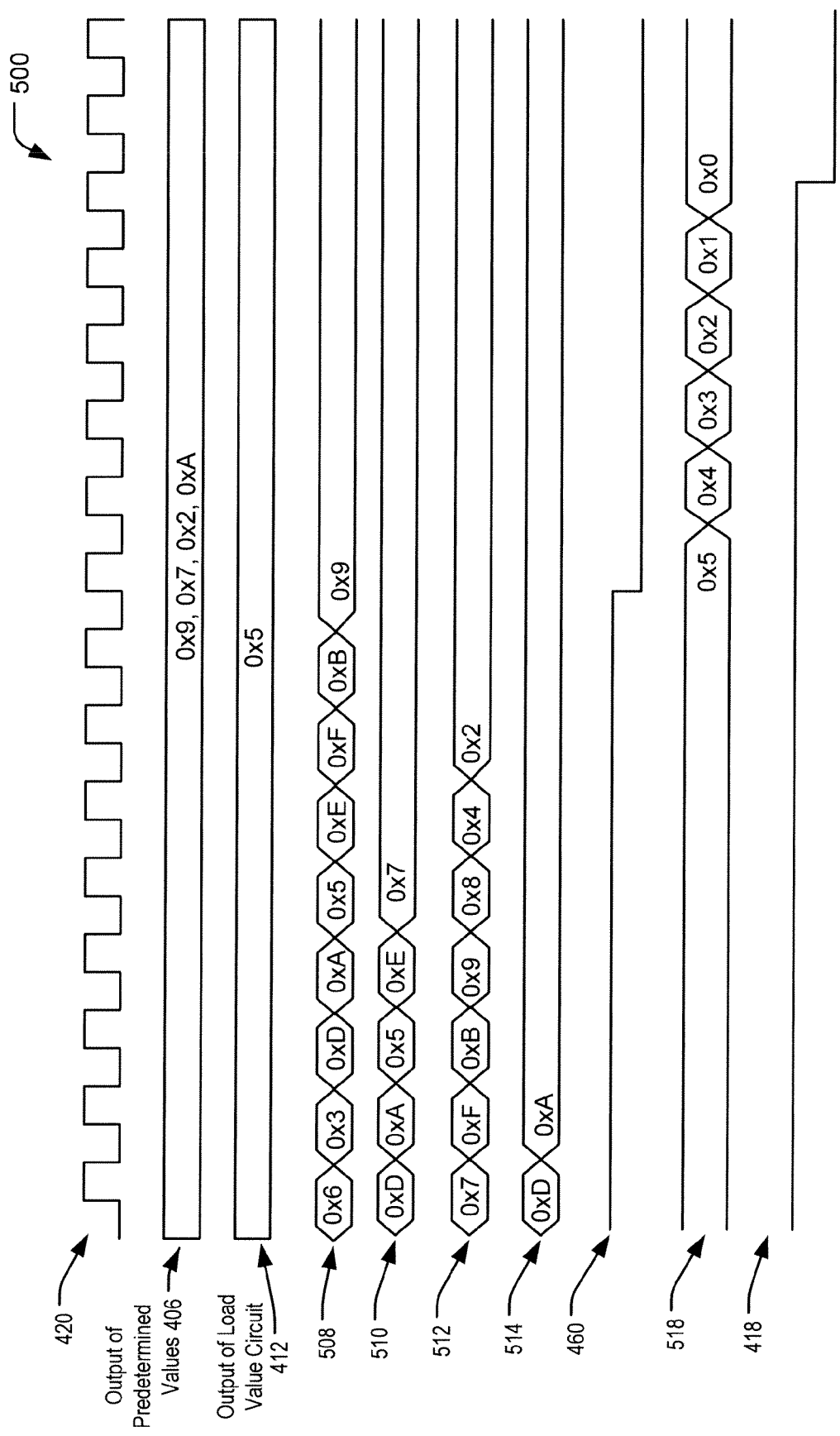
FIG. 5 is a timing diagram illustrating signals of the power on reset circuit of FIG. 4.

In a particular embodiment, the first LFSR 204 may continue to transition between states and generate the first multi-bit value 244 until the comparison circuit 202 determines that the first multi-bit value 244 matches a predetermined value (e.g., the first predetermined value 112 of FIG. 1) as described further in FIGS. 4-5. For example, if the first predetermined value is "0xE", the first LFSR may stop generating values after the first 11 state changes illustrated in FIG. 3, when the value 244 of the first LFSR matches the "0xE" state.

Referring to FIG. 4, a particular illustrative embodiment of a power on reset circuit 400 that controls a power on reset signal is shown. The power on reset circuit 400 includes a first stage 477 and a second stage 479. The first stage 477 includes a plurality of linear feedback shift registers (LFSRs) 404, predetermined values 406, a plurality of match circuits 408, and a first stage output circuit 414. The second stage 479 includes a counter 410, a load value circuit 412, and a second stage output circuit 416. The first stage 477 may be configured to assert a first stage completion signal 460 when values from the predetermined values 406 match values from the plurality of LFSRs 404, as determined by the plurality of match circuits 408 and the first stage output circuit 414. The second stage 479 may be configured to assert a second stage completion signal 470 when the counter 410 reaches a particular count as determined by the second stage output circuit 416. In a particular embodiment, the second stage output signal 470 is the power on rest signal 418. In this case, the power on reset signal 418 is asserted based on a completion of both the first stage 477 and the second stage 479, as indicated, respectively, by the first stage completion signal 460 and the second stage completion signal 470.

The plurality of LFSRs 404 may include a first LFSR 405, a second LFSR 407, a third LFSR 409, and a fourth LFSR 411. In a particular embodiment, the first LFSR 405 and the second LFSR 407 are, respectively, the first LFSR 108 and the second LFSR 110 of FIG. 1. Each LFSR of the plurality of LFSRs 404 may be configured to generate a multi-bit value that is provided to the plurality of match circuits 408. The plurality of match circuits 408 may include a first match circuit 421, a second match circuit 422, a third match circuit 424, and a fourth match circuit 426. Although the term "match circuit" is used, the match circuits 421, 422, 424, and 426 may also be considered a first type of "comparison circuit." Each match circuit 421-426 may be configured to compare a multi-bit value from a particular LFSR to a predetermined value from the predetermined values 406. For example, the first match circuit 421 may compare the first multi-bit value 480 from the first LFSR 405 to a corresponding predetermined value from the predetermined values 406. For simplicity, FIG. 4 only illustrates the connection between the first LFSR 405 and the first match circuit 421. However, the second LFSR 407, the third LFSR 409, and the fourth LFSR 411 may each provide, respectively, a multi-bit value to the second match circuit 422, the third match circuit 424, and the fourth match circuit 426.

The match circuits 421-426 of the comparison circuit 408 may include exclusive-OR (XOR) circuits that are used to perform the comparison of the multi-bit values of the plurality 404 of the LFSRs to the predetermined values 406. Although XORs are illustrated, other logic may be used to achieve substantially similar operation. In a particular embodiment, the first match circuit 421 includes a first XOR circuit 450, a second XOR circuit 452, a third XOR circuit 454, and a fourth XOR circuit 456. An output of a particular XOR circuit may transition from a high logic level to a low logic level or vice versa based on a comparison of a bit of a multi-bit value from a LFSR and a bit of a corresponding predetermined value. For example, when the first XOR circuit 450 determines that a first bit of the first multi-bit value 480 matches a bit of a corresponding predetermined value, an output 481 of the first XOR circuit 450 may transition from a high logic level to a low logic level. Although only the XOR circuits 450-456 of the first match circuit 421 are illustrated in FIG. 4, the second match circuit 422, the third match circuit 424, and the fourth match circuit 426 may also include similar XOR circuits.

An output of each XOR circuit 450-456 of the first match circuit 421 is coupled to an input of a first match OR circuit 458. Although the term "first match OR circuit" is used, the circuit 458 may be considered a second type of comparison circuit. In a particular embodiment, the output 481 of the first XOR circuit 450, an output 482 of the second XOR circuit 452, an output 484 of the third XOR circuit 454, and an output 486 of the fourth XOR circuit 456 are each coupled to an input of the first match OR circuit 458. An output of the first match OR circuit 458 is coupled to provide a first signal 493 to an input of the first stage output circuit 414. The first match OR circuit 458 may be configured to maintain the first signal 493 at a high logic level until each output 481-486 of the XOR circuits 450-456 is at a low logic level, at which time the first signal 493 may transition to a low logic level. In this case, when the first signal 493 is at the low logic level, each bit of the multi-bit value 480 matches a bit of the corresponding predetermined values 406.

The second match circuit 422, the third match circuit 424, and the fourth match circuit 426 may also include corresponding match OR circuits that receive inputs from XOR circuits and each generate a signal 490-492 (e.g., a second signal 492, a third signal 491, a fourth signal 490) to a respective input of the first stage output circuit 414. In a particular embodiment, the first match circuit 421 asserts the first signal 493 in response to a first state of the first LFSR 405 and the second match circuit 422 asserts the second signal 492 in response to a second state of the second LFSR 407. The first signal 493 and the second signal 492 may be asserted independently of each other. The first stage output circuit 414 may be configured to assert the first stage completion signal 460 based on the signals 490-493 of the match OR circuits of the match circuits 421-426. For example, the first stage output circuit 414 may be configured to maintain the first stage completion signal 460 at a high logic level until each signal 490-493 of the match OR circuits of the match circuits 421-426 are at a low logic level, at which time the first stage completion signal 460 may transition from a high logic level to a low logic level. In this case, a low logic level at the first stage completion signal 460 may indicate that each LFSR has generated a value (e.g., the first multi-bit value 480) that matches a corresponding predetermined value 406. The first stage completion signal 460 may be provided to the counter 410 to indicate that the first stage 477 is complete.

In the second stage 479, the counter 410 may be a countdown counter or a reset counter that is configured to count down from a starting value to zero in response to detecting a low logic level at the first stage completion signal 460. Although a count-down counter is illustrated, any type of counter (e.g., a count-up counter) may be used to achieve substantially similar operation. For example, the first stage completion signal 460 may be provided to a reset input of the counter 410. In a particular embodiment, the counter 410 is configured to load the starting value from a load value circuit 412. For example, the counter 410 may load the starting value "1111" from the load value circuit 412. The counter 410 may be configured to generate a non-zero multi-bit value to the second stage output circuit 416 prior to the counter 410 reaching zero and has all zero values when the counter 410 has reached zero. As a result, the second stage output circuit 416 may assert the second stage completion signal 470 a predetermined number of clock cycles after the first stage completion signal 460 is asserted. In a particular embodiment, the counter 410 determines the minimum amount of time that a reset will occur and is fixed. Thus, the time for reset is determined by a variable part (e.g., the matching of values from the LFSRs 404 to the predetermined values 406) and a fixed part (e.g., the countdown of the counter 410). The second stage output circuit 416 may be considered a third type of comparison circuit. The second stage output circuit 416 may be configured to transition the second stage completion signal 470 from a high logic level to a low logic level in response to the counter 410 reaching a terminal value (e.g. countdown to a zero value).

During operation, the power on reset signal 418 may be at a high logic level upon power-up due to the counter 410 loading a non-zero starting value. In this case, a system responsive to the power on reset signal 418 may prevent operation of circuits of the system while the power on reset signal 418 is at a high logic level. The duration of time that the power on reset signal 418 is at the high logic level may be based on a length of the countdown of the counter 410 and the largest number of values that a last matching LFSR of the plurality 404 of the LFSRs generates before matching with a corresponding predetermined value 406.

At time 468, the plurality 404 of the LFSRs may generate values (e.g., the first LFSR 405 generates the first multi-bit value 480). The values of the plurality 404 of the LFSRs may be compared by the match circuits 408 to the predetermined values 406. When each XOR circuit (e.g., XOR circuits 450-456) of each match circuit 421-426 indicates that the value from a particular LFSR matches the predetermined value 406, the signals 490-493 from the match OR circuits (e.g., the first match OR circuit 458) may transition from a high logic level to a low logic level. In response to each signal 490-493 transitioning to a low logic level, the first stage output circuit 414, at time 471, transitions the first stage completion signal 460 from a high logic level to a low logic level. Because each LFSR may start in a random state, the amount of time for all LFSRs to match their predetermined values can vary at each power-on event, and therefore a length of time between time 468 and time 471 is variable within a bounded range. At time 471, the power on reset signal 418 remains high after the comparison of the values of the plurality of the LFSRs 404.

In response to detecting that the first stage completion signal 460 has transitioned from a high logic level to a low logic level, the counter 410 may count down from the starting value to zero. When the counter 410 reaches zero, the second stage completion signal 470 may transition from a high logic level to a low logic level resulting in a transition of the power on reset signal 418 from a high logic level to a low logic level, at time 472. In this case, the power on reset signal 418 may be asserted (to a high logic level) in response to a power-up event and de-asserted in response to the second stage completion signal 470 being asserted (to a low logic level). For example, the power on reset signal 418 may be de-asserted a predetermined number of clock cycles after the first stage completion signal 460 is asserted.

By transitioning the power on reset signal 418 after each LFSR matches a particular predetermined value, the power on reset signal 418 may be provided to the other circuits of a system after a specific duration. The duration of the power on reset signal 418 may be selected to correspond to the time the other circuits use to initialize following a reset. In this case, the other circuits of the system may be initialized and ready for operation after the power on reset signal 418 is transitioned from a high logic level to a low logic level.

Referring to FIG. 5, a timing diagram 500 of the power on reset circuit 400 of FIG. 4 is shown. The timing diagram 500 illustrates the clock signal 420 that is applied to each LFSR of the plurality of LFSRs 404 and to the counter 410. The timing diagram 500 also illustrates an output of the predetermined values 406 and the multi-bit values of each of the LFSRs of the plurality of LFSRs 404. For example, the first multi-bit value 508 may correspond to the first multi-bit value 480 that is generated by the first LFSR 405, a second multi-bit value 510 may correspond to a multi-bit value of the second LFSR 407, a third multi-bit value 512 may correspond to a multi-bit value of the third LFSR 409, and a fourth multi-bit value 514 may correspond to a multi-bit value of the fourth LFSR 411.

A LFSR of the plurality of LFSRs 404 may generate new values in a sequence until a match circuit 408 detects a match between the value of the LFSR and a corresponding predetermined value. As illustrated in the timing diagram 500, the output of the predetermined values 406 is four hexadecimal numbers: "0x9, 0x7, 0x2, 0xA." In this case, the hexadecimal number "0x9" may be the corresponding predetermined value of the first LFSR 405, the hexadecimal number "0x7" may be the corresponding predetermined value of the second LFSR 407, the hexadecimal number "0x2" may be the corresponding predetermined value of the third LFSR 409, and the hexadecimal number "0xA" may be the corresponding predetermined value of the fourth LFSR 411. Each hexadecimal number may correspond to a four bit binary number. For example, "0x8" may represent a binary state of "1000."

As illustrated in the timing diagram 500, the first multi-bit value 508 of the first LFSR 405 generates a hexadecimal number sequence of "0x6, 0x3, 0xD, 0xA, 0x5, 0xE, 0xF, 0xB" before generating the value "0x9" that matches the predetermined value "0x9." As another example, the second multi-bit value 510 of the second LFSR 407 generates a hexadecimal number sequence of "0xD, 0xA, 0x5, 0xE" before generating the value "0x7" that matches the predetermined value "0x7." The third multi-bit value 512 generates a hexadecimal number sequence of "0x7, 0xF, 0xB, 0x9, 0x8, 0x4" before generating the value "0x2" that matches the predetermined value "0x2." The fourth multi-bit value 514 generates a hexadecimal number sequence of "0xD" before generating the value "0xA" that matches the predetermined value "0xA." Each LFSR stops transitioning and holds its state upon matching its predetermined value. As a result, the match circuits hold their respective outputs.

When each value of the LFSRs matches a corresponding predetermined value, the first stage output circuit 414 may transition the first stage completion signal 460 from a high logic level to a low logic level, as illustrated in the timing diagram 500. In response to detecting the low logic level at the first stage completion signal 460, the counter 410 may start counting down from a starting value to zero. The starting value may be loaded from the load value circuit 412. As illustrated in the timing diagram 500, a hexadecimal number "0x5" is loaded from the output of the load value circuit 412 to a count 518 of the counter 410. When the counter 518 reaches the hexadecimal number "0x0", the second stage output circuit 416 transitions the second stage completion signal 470, and the second stage power on reset signal 418, from a high logic level to a low logic level, as illustrated in the timing diagram 500.

Figure 6:
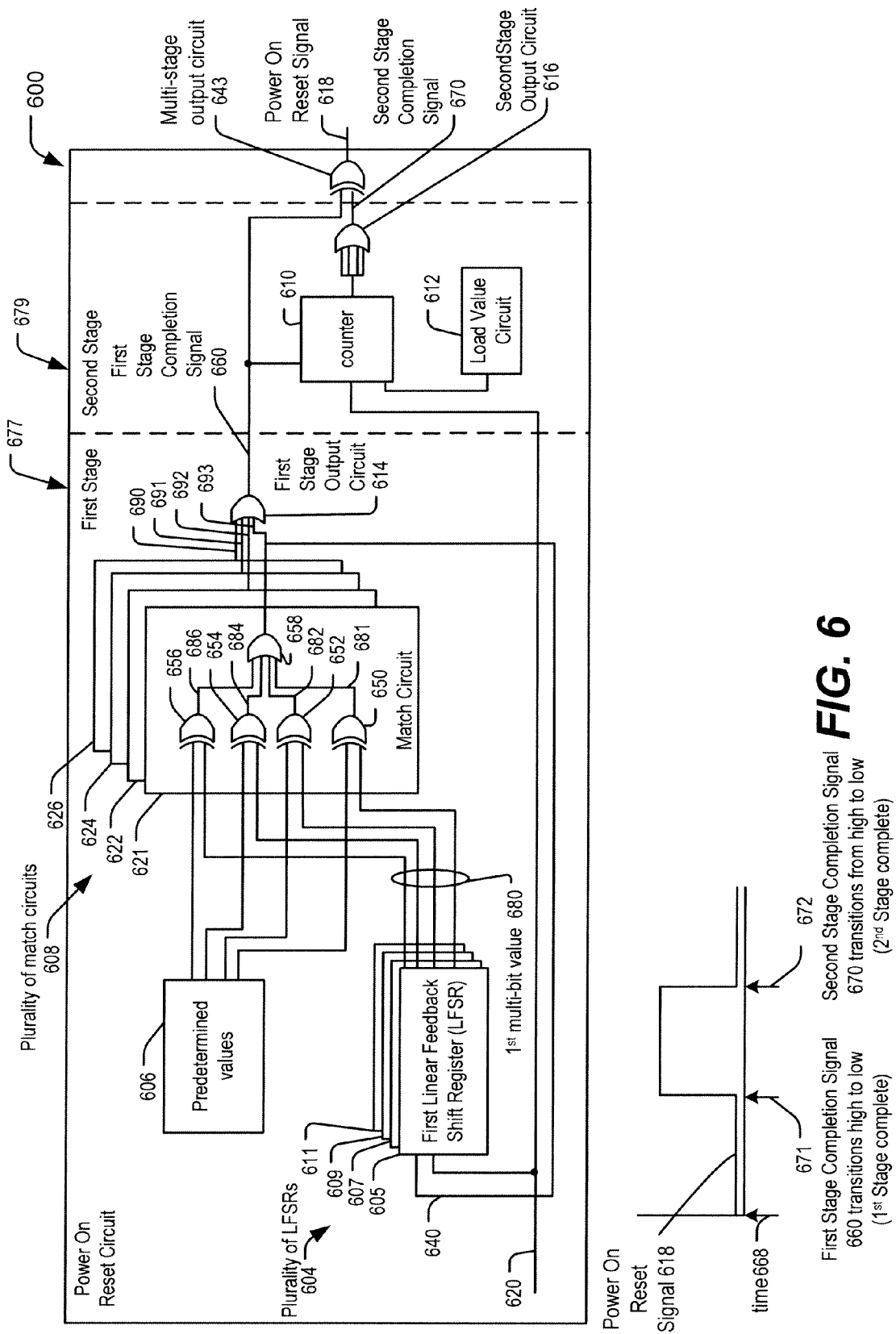
FIG. 6 is a diagram of a particular illustrative embodiment of a power on reset circuit that uses multiple linear feedback shift registers operating in parallel.

Referring to FIG. 6, a particular illustrative embodiment of a power on reset circuit 600 that controls a power on reset signal is shown. The power on reset circuit 600 includes a first stage 677 and a second stage 679. The first stage 677 includes a plurality of linear feedback shift registers (LFSRs) 604, predetermined values 606, a plurality of match circuits 608, and a first stage output circuit 614. The second stage 679 includes a counter 610, a load value circuit 612, and a second stage output circuit 616. The first stage 677 may be configured to assert a first stage completion signal 660 when values from the predetermined values 606 match values from the plurality of LFSRs 604, as indicated by the plurality of match circuits 608 and the first stage output circuit 614. The second stage 679 may be configured to assert a second stage completion signal 670 when the counter 610 reaches a particular count as indicated by the second stage output circuit 616. A multi-stage output circuit 643 may be configured to assert a power on reset signal 618 based on the first stage completion signal 660 and the second stage completion signal 670.

The plurality of LFSRs 604 may include a first LFSR 605, a second LFSR 607, a third LFSR 609, and a fourth LFSR 611. In a particular embodiment, the first LFSR 605 and the second LFSR 607 are, respectively, the first LFSR 108 and the second LFSR 110 of FIG. 1. Each LFSR of the plurality of LFSRs 604 may be configured to generate a multi-bit value that is provided to the plurality of match circuits 608. The plurality of match circuits 608 may include a first match circuit 621, a second match circuit 622, a third match circuit 624, and a fourth match circuit 626. The first stage 677 operates in a substantially similar manner as the first stage 477 of FIG. 4. The first stage completion signal 660 may be provided to the counter 610 and to the multi-stage output circuit 643 to indicate that the first stage 677 is complete.

The second stage 679 operates in a substantially similar manner as the second stage 479 of FIG. 4. The output 641 of the second stage output circuit 616 may be coupled to an input of the multi-stage output circuit 643.

The multi-stage output circuit 643 may be configured to transition a power on reset signal 618 based on the first stage completion signal 660 and the second stage completion signal 670. For example, when both the first completion signal 660 and the second completion signal 670 are at a high logic level (e.g., neither the first stage 677 nor the second stage 679 has been completed), the multi-stage output circuit 643 may maintain the power on reset signal 618 at a low logic level. In this case, when the first stage completion signal 660 transitions to a low logic level (e.g., when the first stage 677 is complete) but the second stage completion signal 670 is at a high logic level (e.g., when the second stage 679 is not complete), the multi-stage output completion circuit 643 may transition the power on reset signal 618 to a high logic level. When the second stage completion signal 670 transitions to a low logic level (e.g., when the second stage 679 is complete) and the first stage completion signal 660 is still at a low logic level, the multi-stage output circuit 643 may transition the power on reset signal 618 to a low logic level. Thus, the power on reset signal 618 is asserted based on a variable part (e.g., the first stage 677) and de-asserted based on a fixed part (e.g., the second stage 679).

During operation, in response to a power on event at time 668, the power on reset signal 618 is maintained at a low logic level while the plurality 604 of the LFSRs generate values (e.g., the first LFSR 605 generates the first multi-bit value 680). The power on reset signal 618 begins at a low logic level when the first stage completion signal 660 and the second stage completion signal 670 are both at a high logic level. The values of the plurality 604 of the LFSRs may be compared by the plurality of match circuits 608 to the predetermined values 606. When the LFSRs match the predetermined values 606, the first stage output circuit 614, at time 671, transitions the first stage completion signal 660 from a high logic level to a low logic level to indicate that the first stage 677 is complete, and the multi-stage output completion circuit 643 transitions the power on reset signal 618 to a high logic level. Because each LFSR may start in a random state, the amount of time for all LFSRs to match their predetermined values can vary at each power-on event, and therefore a length of time between time 668 and time 671 is variable within a bounded range.

In response to the first stage completion signal 660 transitioning from a high logic level to a low logic level, the counter 610 may count down from the starting value to zero. When the counter 610 reaches zero, the second stage output circuit 616 transitions the second stage completion signal 670 from a high logic level to a low logic level to indicate that the second stage 679 is complete, and the power on reset signal 618 transitions from a high logic level to a low logic level, at time 672. In this case, the power on reset signal 618 is asserted at a high logic level in response to the first stage completion signal 660 being asserted at a low logic level (e.g., the first stage 677 is complete) and de-asserted in response to the second stage completion signal 670 being asserted (e.g., the second stage 679 is complete). For example, the power on reset signal 618 may be de-asserted a predetermined number of clock cycles after the first stage completion signal 660 is asserted.

By transitioning the power on reset signal 618 when each LFSR matches a particular predetermined value, the power on reset signal 618 may be provided to other circuits of a system after a duration having an upper bound based on the longest sequence length of the LFSRs 605-611. The duration of the power on reset signal 618 may be selected to correspond to the time the other circuits use to initialize following a reset. In this case, the other circuits of the system may be initialized and ready for operation after the power on reset signal 618 is transitioned from a high logic level to a low logic level.

Figure 7:
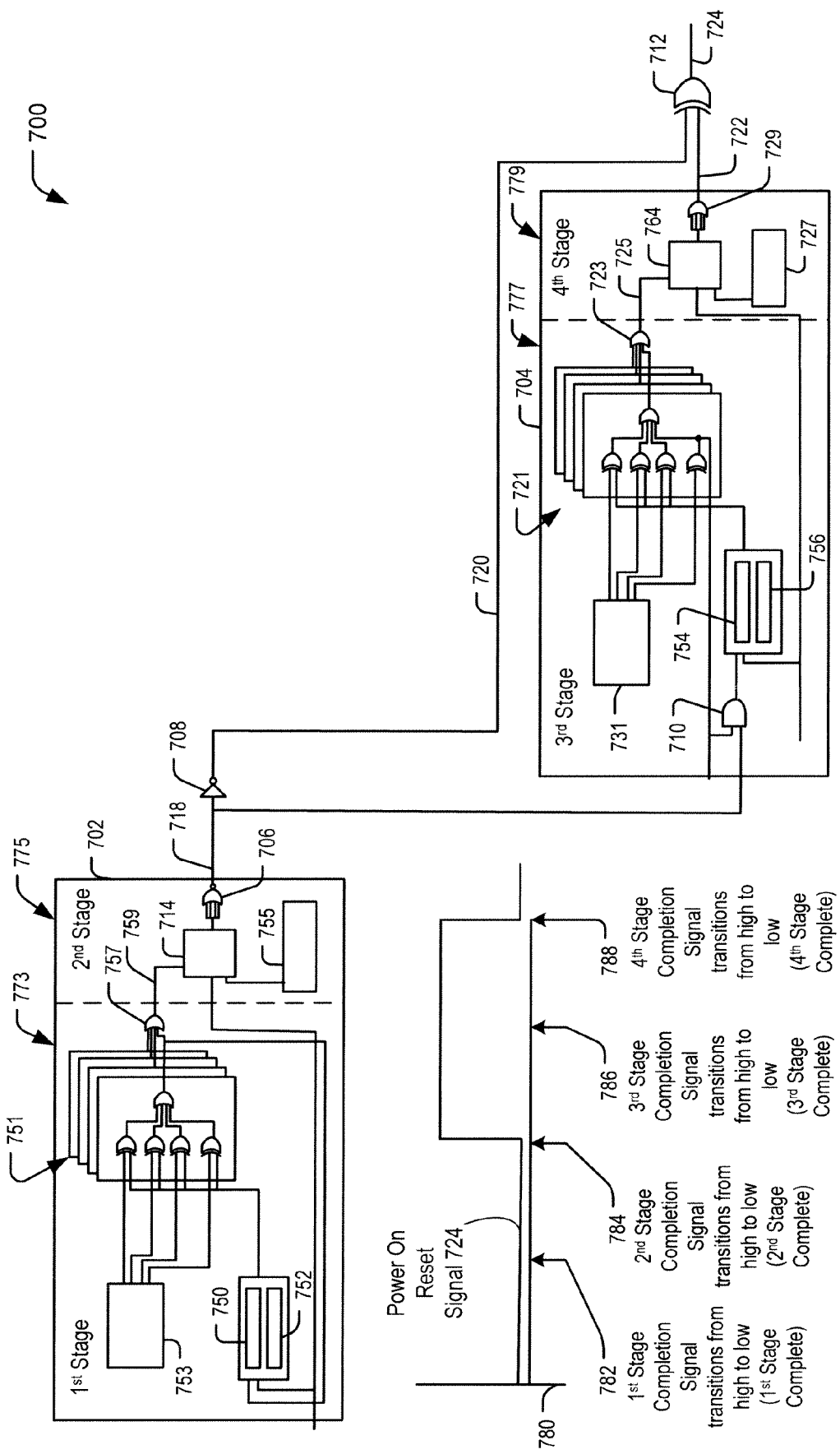
FIG. 7 is a diagram of a particular illustrative embodiment of a system that includes a power on reset circuit that uses multiple linear feedback shift registers operating in parallel.

Referring to FIG. 7, a particular illustrative embodiment of a system 700 that controls a power on reset signal is shown. The system 700 includes a first power on reset circuit 702 and a second power on reset circuit 704 that are coupled in a cascade configuration. The cascade configuration enables the system 700 to assert a power on reset signal 724 as a pulse with a width that is based on the second power on reset circuit 704.

The first power on reset circuit 702 includes components corresponding to components of the power on reset circuit 400 of FIG. 4. For example, the first power on reset circuit 702 includes a first stage 773 and a second stage 775. The first stage 773 includes a first LFSR 750, a second LFSR 752, predetermined values 753, a plurality of match circuits 751, and a first stage output circuit 757 that is configured to assert a first stage completion signal 759. The second stage 775 includes a counter 714, a load value circuit 755, and a second stage output circuit 706 that is configured to assert a second stage completion signal 718. The second stage output circuit 706 may be an inverse OR (NOR) circuit.

The second power on reset circuit 704 includes components corresponding to components of the power on reset circuit 400 of FIG. 4. For example, the second power reset circuit 702 includes a third stage 777 and a fourth stage 779. The third stage 777 includes an AND circuit 710, a first LFSR 754, a second LFSR 756, predetermined values 731, a plurality of match circuits 721, and a third stage output circuit 723 that is configured to assert a third stage completion signal 725. The fourth stage 779 includes a counter 764, a load value circuit 727, and a fourth stage output circuit 729 that is configured to assert a fourth stage completion signal 722. The fourth stage output circuit 729 may be an OR circuit.

A multi-stage output circuit 712 may be configured to assert the power on reset signal 724 based on the fourth stage completion signal 722 and an inverse 720 of the second stage completion signal 718 generated by an inverter 708. In a particular embodiment, the multi-stage output circuit 712 is an XOR circuit. In this case, when both the inverse 720 of the second stage completion signal 718 is at the same logic level as the fourth stage completion signal 722, the multi-stage output circuit 712 may transition to or maintain the power on reset signal 724 at a low logic level. When the fourth stage completion signal 722 and the inverse 720 of the second stage completion signal 718 are at different logic levels, the multi-stage output circuit 712 may transition to or maintain the power on reset signal 724 at a high logic level.

During operation, in response to a power-up event, at time 780, the power on reset signal 724 may be maintained at a low logic level. Between time 780 and time 782, the first stage output circuit 757 may hold the first stage completion signal 759 de-asserted while at least one LFSR 750, 752 does not match its predetermined value 753. When the first stage completion signal 759 is asserted, the second stage completion signal 718 may be at a low logic level (e.g., the second stage 875 is not complete). In response to a second stage completion signal 718 at a low logic level, the AND circuit 710 may disable operation of the first LFSR 754 and the second LFSR 756 of the second power on reset circuit 704. In this case, the counter 764 holds its output at a starting value, causing the fourth stage completion signal 722 to be deasserted (e.g., to have a high logic level). When both the inverse 720 of the second stage completion signal 718 and the fourth stage completion signal 722 are at a high logic level, the multi-stage output circuit 712 maintains the power on reset signal 724 at a low logic level, as illustrated at time 780.

In the first power on reset circuit 702, when the plurality of match circuits 751 determine that the values of the first LFSR 750 and the second LFSR 752 match the predetermined values 753, the first stage output circuit 757 may assert the first stage completion signal 759 (e.g., the first stage 773 is complete), at time 782. The counter 714 may start a countdown in response to detecting that the first stage completion signal 759 is asserted. When the second stage output circuit 706 determines that the counter 714 has completed the countdown, the second stage completion signal 718 may be transitioned to a high logic level. In response to receiving the second stage completion signal 718 at the high logic level, the AND circuit 710 enables the first LFSR 754 and the second LFSR 756 to begin generating values. When the inverse 720 of the second stage completion signal 718 is at a low logic level (e.g., the second stage 775 is complete) and the fourth stage completion signal 722 is at a high logic level (e.g., the fourth stage 779 is not complete), the multi-stage output circuit 712 may assert the power on reset signal 724, at 784.

In the second power on reset circuit 704, when the plurality of match circuits 721 determine that the values of the first LFSR 754 and the second LFSR 756 match the predetermined values 731, the third stage output circuit 723 may assert the third stage completion signal 725 (e.g., the third stage 777 is complete), at time 786. The counter 764 may start a countdown in response to detecting that the third stage completion signal 725 is asserted. When the fourth stage output circuit 729 determines that the counter 764 has completed the countdown, the fourth stage completion signal 722 may be asserted. When the inverse 720 of the second stage completion signal 718 is at a low logic level (e.g., the second stage 775 is complete) and the fourth stage completion signal 722 is at a low logic level (e.g., the fourth stage 779 is complete), the multi-stage output circuit 712 may de-assert the power on reset signal 724, at 788.

By turning on the power on reset signal 724 in response to the first power on reset circuit 702 and turning off the power on reset signal 724 in response to the second power on reset circuit 704, the system 700 may generate a pulse power on reset signal 724 beginning after a variable delay from times 780-782 and a fixed delay from time 782 to 784 (i.e., the delay is variable but has an upper bound and a lower bound). The power on reset signal 724 is asserted for a duration including a variable time from 784 to 786 and a fixed time from 786 to 788 (i.e., the pulse duration is variable with an upper and lower bound).

Figure 8:
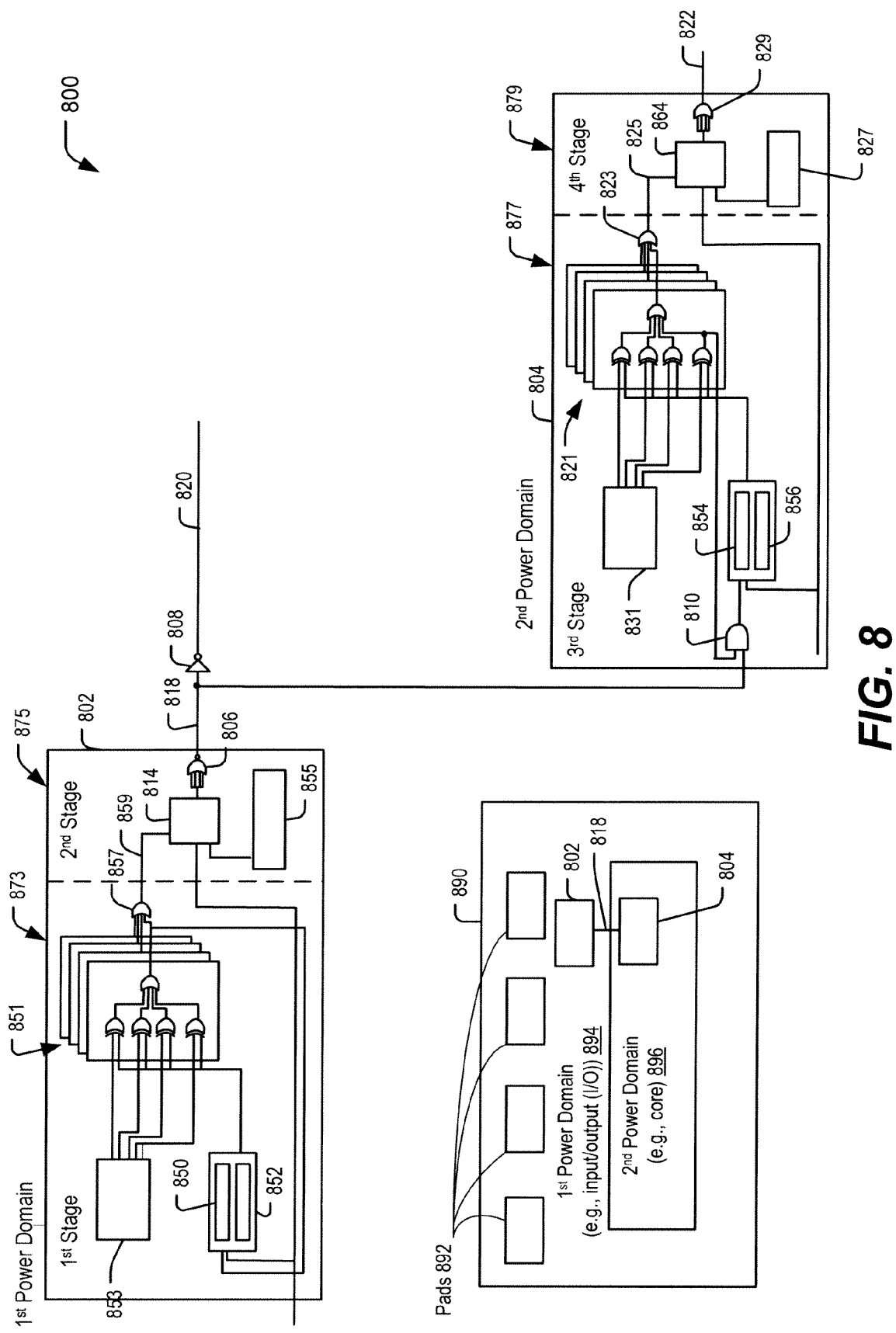
FIG. 8 is a diagram of a particular illustrative embodiment of a system that includes a power on reset circuit that uses multiple linear feedback shift registers operating in parallel.

Referring to FIG. 8, a particular illustrative embodiment of a system 800 is shown that is implemented on a die 890 that includes multiple power domains and multiple power on reset circuits that control power on reset signals to the power domains. The die 890 includes pads (e.g., wire bonding pads) 892 and circuits that are part of a first power domain 894 of the system 800 (e.g., an input/output (I/O) domain) A second power domain 896 may be a core domain that may include logic circuitry configured to operate at a lower voltage than the first domain 894. A first power on reset circuit 802 controls a first power on reset signal 820 to the first power domain 894 and a second power on reset circuit 804 controls a second power on reset signal 822 to the second power domain 896.

The first power on reset circuit 802 includes components corresponding to components of the power on reset circuit 400 of FIG. 4. For example, the first power on reset circuit 802 includes a first stage 873 and a second stage 875. The first stage 873 includes a first LFSR 850, a second LFSR 852, predetermined values 853, a plurality of match circuits 851, and a first stage output circuit 857 that is configured to assert a first stage completion signal 859. The second stage 875 includes a counter 814, a load value circuit 855, and a second stage output circuit 806 that is configured to assert a second stage completion signal 818. The second stage output circuit 806 may be an inverse OR (NOR) circuit.

The second power on reset circuit 804 includes components corresponding to components of the power on reset circuit 400 of FIG. 4. For example, the second power reset circuit 802 includes a third stage 877 and a fourth stage 879. The third stage 877 includes an AND circuit 810, a first LFSR 854, a second LFSR 856, predetermined values 831, a plurality of match circuits 821, and a third stage output circuit 823 that is configured to assert a third stage completion signal 825. The fourth stage 879 includes a counter 864, a load value circuit 827, and a fourth stage output circuit 829 that is configured to assert the second power on reset signal 822 (i.e., the fourth stage completion signal). The fourth stage output circuit 829 may be an OR circuit.

During operation, the first stage output circuit 857 may hold the first stage completion signal 859 de-asserted while at least one LFSR 850, 852 does not match its predetermined value 853. When the first stage completion signal 859 is asserted, the second stage completion signal 818 may be at a high logic level. In this case, an inverter 808 may invert the second stage completion 818 to maintain the first power on reset signal 820 at a low logic level. In response to a high logic level at the second stage completion signal 818, the AND circuit 810 may disable operation of the first LFSR 854 and the second LFSR 856 of the second power on reset circuit 804. In this case, the counter 864 holds its output at a starting value, causing the second power on reset signal 822 to be deasserted (e.g., to have a high logic level).

In the first power on reset circuit 802, when the plurality of match circuits 851 determine that the values of the first LFSR 850 and the second LFSR 852 match the predetermined values 853, the first stage output circuit 857 may assert the first stage completion signal 859 (e.g., the first stage 873 is complete). The counter 814 may start a countdown in response to detecting that the first stage completion signal 859 is asserted. When the second stage output circuit 806 determines that the counter 814 has completed the countdown, the second stage completion signal 818 may be transitioned to a high logic level. In response to receiving, the second stage completion signal 818 at a high logic level, the AND circuit 810 may send a signal that enables the first LFSR 854 and the second LFSR 856 to begin generating values.

In the second power on reset circuit 804, when the plurality of match circuits 821 determine that the values of the first LFSR 854 and the second LFSR 856 match the predetermined values 831, the third stage output circuit 823 may assert the third stage completion signal 825 (e.g., the third stage 877 is complete). The counter 864 may start a countdown in response to detecting that the third stage completion signal 825 is asserted. When the fourth stage output circuit 829 determines that the counter 864 has completed the countdown, the second power on reset signal 822 may be asserted.

As a result, when both the first power domain 894 and the second power domain 896 experience a power up-event, the second power domain 896 is held in a reset state until after the first power domain 894 has initialized. For example, the first power domain 894 may receive or generate a clock signal or other control signals that are used by the second power domain 896. Such signals are initialized via the first power on reset signal 820 prior to enabling operation of the second power on reset circuit 804 in the second power domain. As another example, the second power domain 896 may be powered-down while the first power domain 894 remains operational. As a result, the first power on reset signal 820 may remain de-asserted while the second power domain 896 is powered down. When the second power domain 896 experiences a power-up event (e.g. a warm boot), the second power on reset signal 822 starts in an asserted state and the LFSRs 854 and 856 start as enabled due to the first power on reset signal 820 remaining at a low logic level. Additional power on reset circuits may be added in parallel, in one or more additional cascaded stages, or any combination thereof, to enable a controlled power-up response among multiple voltage domains (e.g. one or more I/O domains, core domains, and memory domains) and among a variety of conditions (e.g. one or multiple domains being powered down). Such power on reset circuits may be configured to operate in accordance with any of the embodiments illustrated in FIGS. 4, 6, and 7, or any combination thereof.

Figure 9:
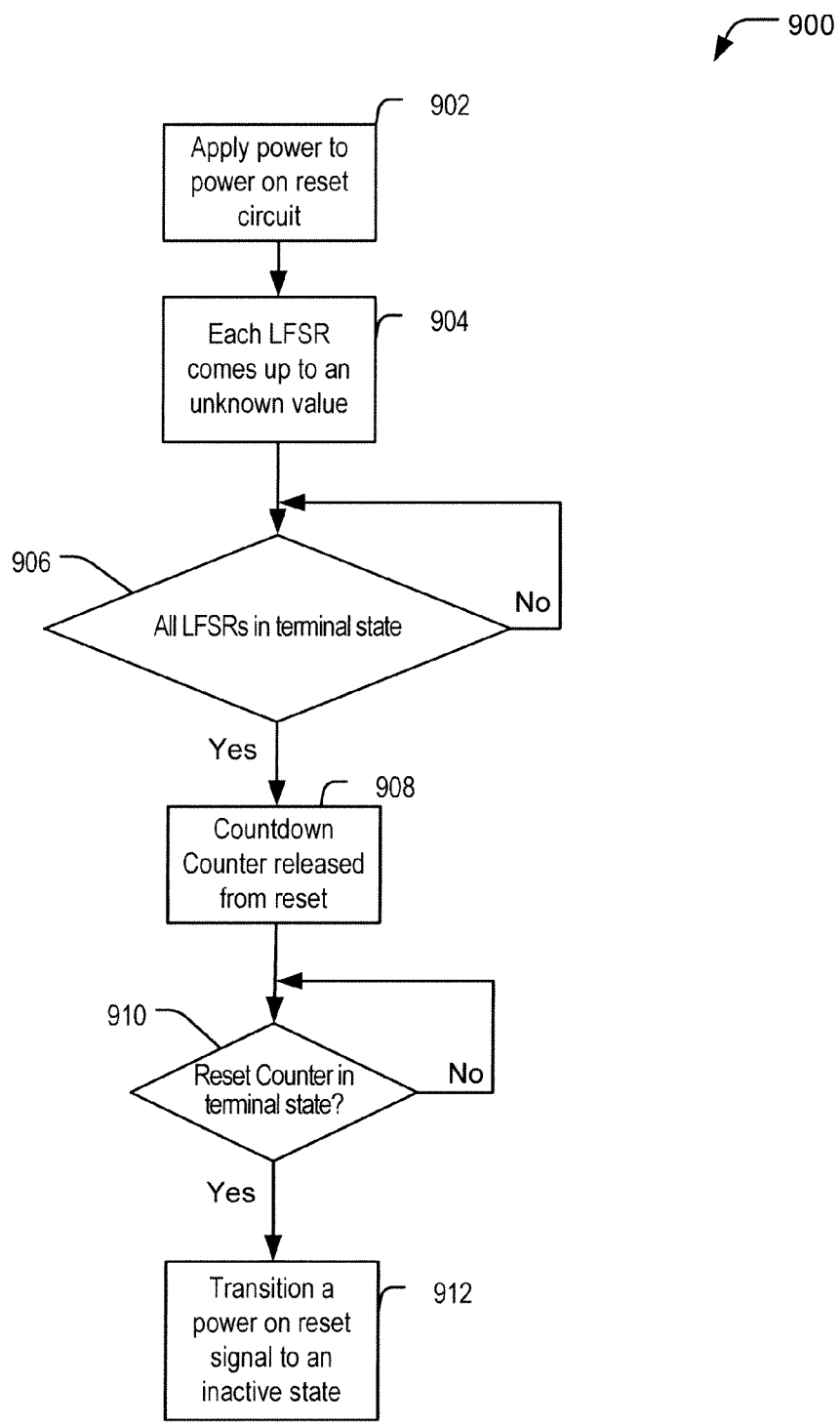
FIG. 9 is a flow chart of a first illustrative embodiment of a method to assert a power on reset signal based on multiple linear feedback shift registers operating in parallel.

Referring to FIG. 9, a method 900 of asserting a power on reset signal is disclosed. The method 900 includes applying power to a power on reset circuit, at 902. For example, the power on reset circuit of FIG. 4 may be powered on. The method 900 also includes each LFSR starting at an unknown value, at 904. For example, each LFSR of the plurality 400 of LFSRs may start at random or pseudo-random values. The first LFSR 405, the second LFSR 407, the third LFSR 409, and the fourth LFSR 411 of FIG. 4 may operate at least partially in parallel. For example, each LFSR 405-411 may be commonly clocked to generate values that are concurrently provided to the plurality of match circuits 408 and the plurality of match circuits 408 compare the values to the predetermined values 406. Although a particular LFSR may generate a value that matches a corresponding predetermined value and consequently stop generating new values independently of values of the other LFSRs, for at least a portion of the startup period two or more LFSRs are operating concurrently.

For example, the first LFSR 405 operates at least partially in parallel with the second LFSR 407 by performing at least one state transition or other activity during an operating period of the second LFSR 407.

At decision block 906, a determination is made whether all LFSRs are in a terminal state (i.e., each LFSR matches a predetermined value). For example, the plurality of match circuits 408 of FIG. 4 may determine whether the values 480 of the plurality of LFSRs 404 match the predetermined values 406. When at least one of the LFSRs does not match a corresponding predetermined value, the method 900 returns to the decision block 906. When each of the LFSRs of the plurality of LFSRs 404 match a corresponding predetermined value, the method 900 includes releasing a countdown counter from reset, at 908. For example, the counter 410 of FIG. 4 may start a countdown in response to receiving the first stage completion signal 460.

The method 900 includes determining whether the reset counter is in a terminal state, at decision block 910. For example, the counter 410 of FIG. 4 counts down from a starting value to zero (the counter's terminal state). When the counter has not reached zero, the method 900 returns to decision block 910. When the counter is determined to have reached a zero count, the method 900 includes transitioning a power on reset signal to an inactive state, at 912. For example, the counter 410 of FIG. 4 may transition the power on reset signal 418 to the low logic level.

The method 900 controls the timing of a power on reset signal based on multiple LFSRs. Multiple LFSRs may provide redundancy that achieves the same probability of a comparison match to initial power up values as a single larger LFSR. By using multiple LFSRs instead of a single larger LFSR, each LFSR operating in parallel may reach a termination condition faster than the single larger LFSR.

Figure 10:
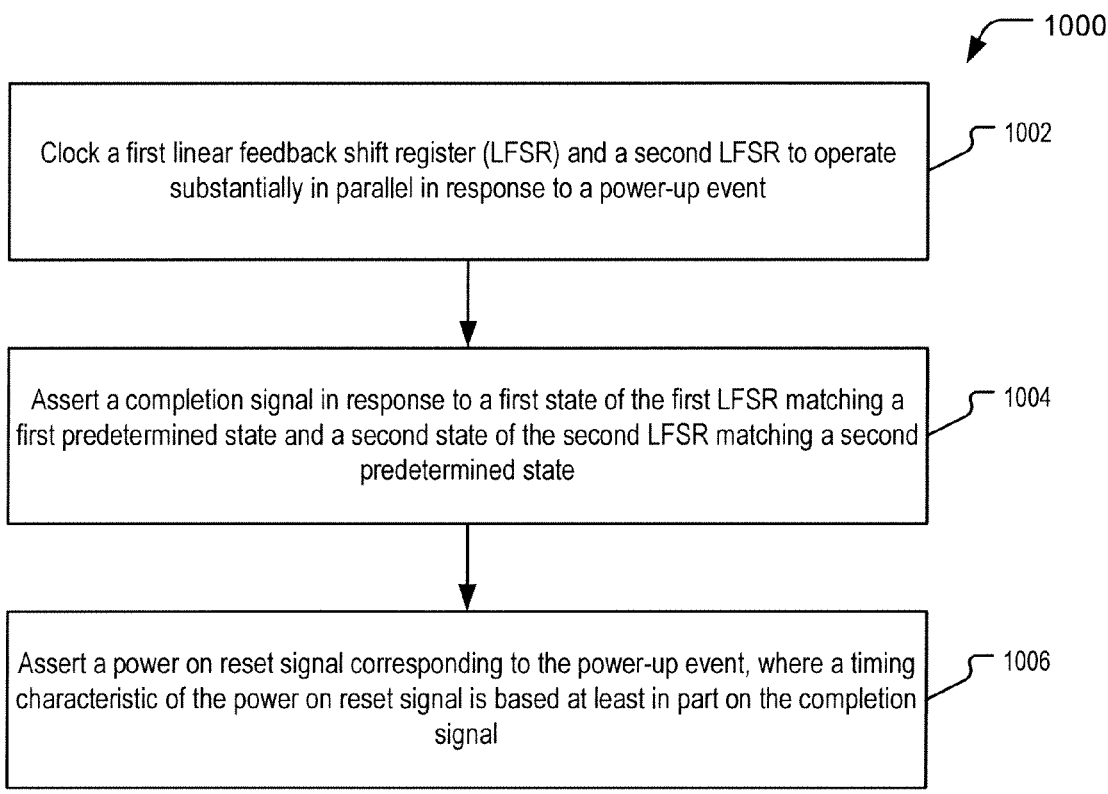
FIG. 10 is a flow chart of a second illustrative embodiment of a method to assert a power on reset signal based on multiple linear feedback shift registers operating in parallel.

Referring to FIG. 10, a method is disclosed and generally designated 1000. The method 1000 includes clocking a first linear feedback shift register (LFSR) and a second LFSR to operate substantially in parallel in response to a power-up event, at 1002. For example, each LFSR 405-411 of FIG. 4 may operate in parallel by generating values that are provided to the plurality of match circuits 408 concurrently (e.g., not serially). In this case, for some non-zero duration, at least two LFSRs may operate in parallel and produce values. The method also includes asserting a completion signal in response to a first state of the first LFSR matching a first predetermined state and a second state of the second LFSR matching a second predetermined state, at 1004. For example, in FIG. 1, the comparison circuit 106 asserts the completion signal 132 when the first value 121 of the first LFSR 108 and the second value 122 of the second LFSR 110 match, respectively, the first predetermined value 112 and the second predetermined value 114. The method further includes asserting a power on reset signal corresponding to the power-up event where a timing characteristic of the power on reset signal is based at least in part on the completion signal, at 1006. The timing characteristic of a power on reset signal may indicate under what conditions the power on reset signal is asserted or de-asserted. For example, in FIG. 1, the power on reset signal generation circuit 130 asserts the power on reset signal 120 in response to receiving the completion signal 132.

The method 1000 controls the timing of a power on reset signal based on multiple LFSRs. By using multiple LFSR instead of a single larger LFSR, each LFSR operating in parallel may reach a termination condition faster than the single larger LFSR.

FIG. 11 is a block diagram of an embodiment of a wireless communication device 1100 that includes a power on reset circuit 1164 that controls a power on reset signal. The wireless communication device 1100 may be implemented as a portable wireless electronic device that includes a processor 1110, such as a digital signal processor (DSP), coupled to a memory 1132.

The power on reset circuit 1164 may control a transition of a power on reset signal. For example, the power on reset circuit 1164 may include one or more of the components or circuits illustrated in one or more of FIGS. 1, 2, 4, 6-8, and may operate in accordance with the methods of one or more of FIGS. 9-10, or any combination thereof.

In a particular embodiment, a display controller 1126 is coupled to the processor 1110 and to a display device 1128. A coder/decoder (CODEC) 1134 can also be coupled to the processor 1110. A speaker 1136 and a microphone 1138 can be coupled to the CODEC 1134. A wireless controller 1140 can be coupled to the processor 1110 and to a wireless antenna 1142. The power on reset circuit 1164 is illustrated as providing one or more power on reset signals to the display control 1126, the CODEC 1134, the processor 1110, a memory 1132, and the wireless controller 1140, which may be in one or more voltage domains (not shown).

In a particular embodiment, the processor 1110, the display controller 1126, the memory 1132, the CODEC 1134, and the wireless controller 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display device 1128, the input device 1130, the speaker 1136, the microphone 1138, the wireless antenna 1142, and the power supply 1144 are external to the system-on-chip device 1122. However, each of the display device 1128, the input device 1130, the speaker 1136, the microphone 1138, the wireless antenna 1142, and the power supply 1144 can be coupled to a component of the system-on-chip device 1122, such as an interface or a controller.

The embodiments illustrated in FIGS. 1-11 are illustrative and variations will be recognized as within the scope of the present disclosure. For example, although the LFSRs of a power on reset circuit may start at a single time, in other embodiments the LFSRs may have staggered starts as long as at least two of the LFSRs operate in parallel at some point. For example, each LFSR 405-411 of FIG. 4 may operate in parallel by generating values that are provided to the plurality of match circuits 408 concurrently (e.g., not serially). In this case, for some non-zero duration, at least two LFSRs may operate in parallel. Also, the number of LFSRs that are used by the power on reset circuit may be any number greater than or equal to two. In a cascade configuration such as in FIGS. 7 and 8, there may be any number of cascade stages. In addition, although some signals are described as being asserted at a high logic level and other signals are described as being asserted at a low logic level, in other embodiments any particular signal may be asserted high or low, with appropriate circuitry modifications, to achieve substantially similar results. Although ANDs, OR, and XORs are illustrated, other logic circuits may be used to achieve substantially similar operation. Although the first LFSR 204 of FIG. 2 is illustrated as a Galois-type LFSR, in other embodiments, only the first stage receives feedback from multiple stages, in a Fibonacci-type configuration.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices, such as a set top box, a music player, a video player, an entertainment unit, a navigation device, a communications device, a personal digital assistant (PDA), a fixed location data unit, or other device.

FIG. 12 depicts a particular illustrative embodiment of an electronic device manufacturing process 1200. Physical device information 1202 is received at the manufacturing process 1200, such as at a research computer 1206. The physical device information 1202 may include design information representing at least one physical property of a semiconductor device, such as the power on reset circuit 102 of FIG. 1, the power on reset circuit 200 of FIG. 2, the power on reset circuit 400 of FIG. 4, the power on reset circuit 600 of FIG. 6, the first power on reset circuit 702 and the second power on reset circuit 704 of FIG. 7, the first power on reset circuit 802 and the second power on reset circuit 804 of FIG. 8, or any combination thereof. For example, the physical device information 1202 may include physical parameters, material characteristics, and structure information that is entered via a user interface 1204 coupled to the research computer 1206. The research computer 1206 includes a processor 1208, such as one or more processing cores, coupled to a computer readable medium such as a memory 1210. The memory 1210 may store computer readable instructions that are executable to cause the processor 1208 to transform the physical device information 1202 to comply with a file format and to generate a library file 1212.

In a particular embodiment, the library file 1212 includes at least one data file including the transformed design information. For example, the library file 1212 may include a library of semiconductor devices including a device that includes one or more of the power on reset circuits illustrated in FIGS. 1, 2, 4, 6, 7, and 8, or any combination thereof, that is provided to use with an electronic design automation (EDA) tool 1220.

The library file 1212 may be used in conjunction with the EDA tool 1220 at a design computer 1214 including a processor 1216, such as one or more processing cores, coupled to a memory 1218. The EDA tool 1220 may be stored as processor executable instructions at the memory 1218 to enable a user of the design computer 1214 to design a circuit including a device that includes one or more of the power on reset circuits illustrated in FIGS. 1, 2, 4, 6, 7, and 8, or any combination thereof, of the library file 1212. For example, a user of the design computer 1214 may enter circuit design information 1222 via a user interface 1224 coupled to the design computer 1214. The circuit design information 1222 may include design information representing at least one physical property of a semiconductor device, such as a device that includes one or more of the power on reset circuits illustrated in FIGS. 1, 2, 4, 6, 7, and 8, or any combination thereof. To illustrate, the circuit design property may include identification of particular circuits and relationships to other elements in a circuit design, positioning information, feature size information, interconnection information, or other information representing a physical property of a semiconductor device.

The design computer 1214 may be configured to transform the design information, including the circuit design information 1222, to comply with a file format. To illustrate, the file formation may include a database binary file format representing planar geometric shapes, text labels, and other information about a circuit layout in a hierarchical format, such as a Graphic Data System (GDSII) file format. The design computer 1214 may be configured to generate a data file including the transformed design information, such as a GDSII file 1226 that includes information describing one or more of the power on reset circuits illustrated in FIGS. 1, 2, 4, 6, 7, and 8, or any combination thereof, in addition to other circuits or information. To illustrate, the data file may include information corresponding to a system-on-chip (SOC) that includes one or more of the power on reset circuits illustrated in FIGS. 1, 2, 4, 6, 7, and 8 and that also includes additional electronic circuits and components within the SOC.

The GDSII file 1226 may be received at a fabrication process 1228 to manufacture information describing one or more of the power on reset circuits illustrated in FIGS. 1, 2, 4, 6, 7, and 8 according to transformed information in the GDSII file 1226. For example, a device manufacture process may include providing the GDSII file 1226 to a mask manufacturer 1230 to create one or more masks, such as masks to be used with photolithography processing, illustrated as a representative mask 1232. The mask 1232 may be used during the fabrication process to generate one or more wafers 1234, which may be tested and separated into dies, such as a representative die 1236. The die 1236 includes a circuit including a device that includes one or more of the power on reset circuits illustrated in FIGS. 1, 2, 4, 6, 7, and 8.

The die 1236 may be provided to a packaging process 1238 where the die 1236 is incorporated into a representative package 1240. For example, the package 1240 may include the single die 1236 or multiple dies, such as a system-in-package (SiP) arrangement. The package 1240 may be configured to conform to one or more standards or specifications, such as Joint Electron Device Engineering Council (JEDEC) standards.

Information regarding the package 1240 may be distributed to various product designers, such as via a component library stored at a computer 1246. The computer 1246 may include a processor 1248, such as one or more processing cores, coupled to a memory 1250. A printed circuit board (PCB) tool may be stored as processor executable instructions at the memory 1250 to process PCB design information 1242 received from a user of the computer 1246 via a user interface 1244. The PCB design information 1242 may include physical positioning information of a packaged semiconductor device on a circuit board, the packaged semiconductor device corresponding to the package 1240 including one or more of the power on reset circuits illustrated in FIGS. 1, 2, 4, 6, 7, and 8, or any combination thereof.

The computer 1246 may be configured to transform the PCB design information 1242 to generate a data file, such as a GERBER file 1252 with data that includes physical positioning information of a packaged semiconductor device on a circuit board, as well as layout of electrical connections such as traces and vias, where the packaged semiconductor device corresponds to the package 1240 including one or more of the power on reset circuits illustrated in FIGS. 1, 2, 4, 6, 7, and 8. In other embodiments, the data file generated by the transformed PCB design information may have a format other than a GERBER format.

The GERBER file 1252 may be received at a board assembly process 1254 and used to create PCBs, such as a representative PCB 1256, manufactured in accordance with the design information stored within the GERBER file 1252. For example, the GERBER file 1252 may be uploaded to one or more machines to perform various steps of a PCB production process. The PCB 1256 may be populated with electronic components including the package 1240 to form a representative printed circuit assembly (PCA) 1258.

The PCA 1258 may be received at a product manufacture process 1260 and integrated into one or more electronic devices, such as a first representative electronic device 1262 and a second representative electronic device 1264. As an illustrative, non-limiting example, the first representative electronic device 1262, the second representative electronic device 1264, or both, may be selected from the group of a set top box, a music player, a video player, an entertainment unit, a navigation device, a communications device, a personal digital assistant (PDA), a fixed location data unit, and a computer, into which the power on reset circuit is integrated. As another illustrative, non-limiting example, one or more of the electronic devices 1262 and 1264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these exemplary illustrated units. Embodiments of the disclosure may be suitably employed in any device which includes active integrated circuitry.

A device that includes one or more of the power on reset circuits illustrated in FIGS. 1, 2, 4, 6, 7, and 8 may be fabricated, processed, and incorporated into an electronic device, as described in the illustrative process 1200. One or more aspects of the embodiments disclosed with respect to FIGS. 1-11 may be included at various processing stages, such as within the library file 1212, the GDSII file 1226, and the GERBER file 1252, as well as stored at the memory 1210 of the research computer 1206, the memory 1218 of the design computer 1214, the memory 1250 of the computer 1246, the memory of one or more other computers or processors (not shown) used at the various stages, such as at the board assembly process 1254, and also incorporated into one or more other physical embodiments such as the mask 1232, the die 1236, the package 1240, the PCA 1258, other products such as prototype circuits or devices (not shown), or any combination thereof. Although various representative stages of production from a physical device design to a final product are depicted, in other embodiments fewer stages may be used or additional stages may be included. Similarly, the process 1200 may be performed by a single entity or by one or more entities performing various stages of the process 1200.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A "storage medium" is non-transitory (i.e., not a transitory propagating signal).

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a power on reset circuit comprising:
        a first linear feedback shift register;
        a second linear feedback shift register,
        wherein the first linear feedback shift register is configured to operate at least partially in parallel with the second linear feedback shift register;
        a first stage output circuit configured to assert a first stage completion signal in response to a first state of the first linear feedback shift register matching a first predetermined value and a second state of the second linear feedback shift register matching a second predetermined value; and
        a power on reset signal generation circuit configured to assert a variable length power on reset signal in response to a power-up event and to de-assert the variable length power on reset signal based at least in part on the completion signal.

2. The apparatus of claim 1, wherein the first linear feedback shift register (LFSR) starts in a first start state in response to the power-up event and the second LFSR starts in a second start state in response to the power-up event, wherein the first start state is a first random or pseudo-random state and wherein the second start state is a second random or pseudo-random state.

3. The apparatus of claim 1, wherein the first linear feedback shift register comprises a set of ordered latching elements including a first latching element, at least one intermediate latching element, and a last latching element, and wherein the first linear feedback shift register further comprises a feedback logic circuit to generate an input to a particular intermediate latching element based on outputs of at least two of the ordered latching elements.

4. The apparatus of claim 1, wherein the power on reset circuit comprises a first stage that comprises the first linear feedback shift register and the second linear feedback shift register, wherein the first stage further comprises the first stage output circuit configured to assert the first stage completion signal in response to the first state of the first linear feedback shift register matching the first predetermined value and the second state of the second linear feedback shift register matching the second predetermined value.

5. The apparatus of claim 4, wherein the first stage further comprises:
a first match circuit configured to assert a first signal in response to the first state of the first linear feedback shift register matching the first predetermined value; and
a second match circuit configured to assert a second signal in response to the second state of the second linear feedback shift register matching the second predetermined value,
wherein the first stage output circuit is coupled to receive the first signal and the second signal and is configured to assert the first stage completion signal in response to the first and second signals being asserted.

6. The apparatus of claim 5, wherein the first signal and the second signal are asserted independently of each other.

7. The apparatus of claim 4, wherein a probability that the first stage output circuit asserts the first stage completion signal during the power-up event is less than a first probability of the first start state matching the first predetermined state and is less than a second probability of the second start state matching the second predetermined state.

8. The apparatus of claim 4, further comprising a second stage, the second stage comprising:
a counter coupled to the first stage output circuit; and
a second stage output circuit coupled to the counter and configured to assert a second stage completion signal a number of clock cycles after the first stage completion signal is asserted.

9. The apparatus of claim 8, wherein the variable length power on reset signal is de-asserted in response to the second stage completion signal being asserted.

10. The apparatus of claim 8, wherein the variable length power on reset signal is asserted in response to the first stage completion signal being asserted and is de-asserted in response to the second stage completion signal being asserted.

11. The apparatus of claim 8, wherein the first stage completion signal is generated by the first stage output circuit and is provided to a reset input of the counter.

12. The apparatus of claim 1, wherein the first linear feedback shift register operates at least partially in parallel with the second linear feedback shift register by performing at least one state transition during an operating period of the second linear feedback shift register.

13. The apparatus of claim 1, integrated in at least one semiconductor die.

14. The apparatus of claim 13, wherein the first linear feedback shift register and the second linear feedback shift register are clocked by a clock signal received from a source external to the at least one semiconductor die.

15. The apparatus of claim 13, wherein the at least one semiconductor die further comprises an oscillator, and wherein the first linear feedback shift register and the second linear feedback shift register are clocked by a clock signal received from the oscillator.

16. The apparatus of claim 1, further comprising a device selected from the group consisting of a set top box, a music player, a video player, an entertainment unit, a navigation unit, a communications device, a personal digital assistant (PDA), a fixed location data unit, and a computer, into which the power on reset circuit is integrated.

17. An apparatus comprising:
a power on reset circuit comprising:
a first stage comprising:
a first linear feedback shift register;
a second linear feedback shift register,
wherein the first linear feedback shift register is configured to operate at least partially in parallel with the second linear feedback shift register; and
a first stage output circuit responsive to the first linear feedback shift register and to the second linear feedback shift register to selectively assert a first stage completion signal; and
a second stage comprising:
a counter coupled to the first stage output circuit; and
a second stage output circuit coupled to the counter and configured to assert a second stage completion signal a number of clock cycles after the first stage completion signal is asserted.

18. The apparatus of claim 17, wherein the first stage output circuit is configured to assert the first stage completion signal in response to a first state of the first linear feedback shift register matching a first predetermined state and a second state of the second linear feedback shift register matching a second predetermined state.

19. The apparatus of claim 17, wherein the first stage comprises a plurality of linear feedback shift registers including the first linear feedback shift register (LFSR) and the second LFSR, and wherein the first stage output circuit is configured to assert the first stage completion signal in response to each particular LFSR, of the plurality of LFSRs having a state that matches a predetermined state corresponding to the particular LFSR.

20. The apparatus of claim 17, wherein a power on reset signal is asserted in response to a power-up event and is de-asserted in response to the second stage completion signal being asserted.

21. The apparatus of claim 17, wherein a power on reset signal is asserted in response to the first stage completion signal being asserted and is de-asserted in response to the second stage completion signal being asserted.

22. The apparatus of claim 17, wherein the power on reset circuit further comprises:
a third stage comprising a third LFSR, a fourth LFSR, and a third stage output circuit; and
a fourth stage comprising a second counter.

23. The apparatus of claim 22, wherein the first stage and the second stage are in a first power domain and wherein the third stage and the fourth stage are in a second power domain.

24. The apparatus of claim 17, integrated in at least one semiconductor die.

25. The apparatus of claim 17, further comprising a device selected from the group consisting of a set top box, a music player, a video player, an entertainment unit, a navigation unit, a communications device, a personal digital assistant (PDA), a fixed location data unit, and a computer, into which the power on reset circuit is integrated.

26. An apparatus comprising: a power on reset circuit comprising:
a first stage comprising:
a first linear feedback shift register;
a second linear feedback shift register,
wherein the first linear feedback shift register is configured to operate at least partially in parallel with the second linear feedback shift register; and
a first stage output circuit responsive to the first linear feedback shift register and to the second linear feedback shift register to selectively assert a first stage completion signal;
a second stage comprising:
a counter coupled to the first stage output circuit; and
a second stage output circuit coupled to the counter and configured to assert a second stage completion signal a predetermined number of clock cycles after the first stage completion signal is asserted;
a third stage comprising:
a third linear feedback shift register;
a fourth linear feedback shift register; and
a third stage output circuit coupled to the third linear feedback shift register and to the fourth linear feedback shift register to selectively assert a third stage completion signal;
and a fourth stage comprising:
a second counter coupled to the third stage output circuit; and
a fourth stage output circuit coupled to the second counter and configured to assert a fourth stage completion signal,
wherein the first and second stages are in a first power domain and wherein the third and fourth stages are in a second power domain.

27. The apparatus of claim 26, wherein the first power domain corresponds to a pad voltage, and wherein the second power domain corresponds to a core voltage.

28. The apparatus of claim 26, integrated in at least one semiconductor die.

29. The apparatus of claim 26, further comprising a device selected from the group consisting of a set top box, a music player, a video player, an entertainment unit, a navigation unit, a communications device, a personal digital assistant (PDA), a fixed location data unit, and a computer, into which the power on reset circuit is integrated.

30. A method comprising:
clocking a first linear feedback shift register (LFSR) and a second LFSR to operate substantially in parallel in response to a power-up event;
asserting a completion signal in response to a first state of the first LFSR matching a first predetermined state and a second state of the second LFSR matching a second predetermined state;
asserting a variable length power on reset signal in response to the power-up event; and
de-asserting the variable length power on reset signal based at least in part on the completion signal.

31. The method of claim 30, wherein the variable length power on reset signal is de-asserted a predetermined number of clock cycles after the completion signal is asserted.

32. The method of claim 30, wherein the variable length power on reset signal is asserted in response to the completion signal being asserted and wherein the variable length power on reset signal is de-asserted a predetermined number of clock cycles after the completion signal is asserted.

33. The method of claim 30, wherein asserting the completion signal and asserting the variable length power on reset signal are performed by a power on reset circuit of an electronic device.

34. An apparatus comprising:
a power on reset circuit comprising:
means for comparing a first state of a first linear feedback shift register to a first predetermined state;
means for comparing a second state of a second linear feedback shift register to a second predetermined state;
means for asserting a completion signal responsive to the first state matching the first predetermined state and the second state matching the second predetermined state;
means for asserting a variable length power on reset signal in response to a power-up event; and
means for de-asserting the variable length power on reset signal based at least in part on the completion signal.

35. The apparatus of claim 34, integrated in at least one semiconductor die.

36. The apparatus of claim 34, further comprising a device selected from the group consisting of a set top box, a music player, a video player, an entertainment unit, a navigation unit, a communications device, a personal digital assistant (PDA), a fixed location data unit, and a computer, into which the power on reset circuit is integrated.

37. A method comprising:
a first step for clocking a first linear feedback shift register (LFSR) and a second LFSR to operate substantially in parallel in response to a power-up event;
a second step for asserting a completion signal in response to a first state of the first LFSR matching a first predetermined state and a second state of the second LFSR matching a second predetermined state;
a third step for asserting a variable length power on reset signal in response to the power-up event; and
a fourth step of de-asserting the power on reset signal based at least in part on the completion signal.

38. The method of claim 37, wherein the second step and the third step are performed by a power on reset circuit integrated into an electronic device.

39. A method comprising:
receiving design information representing at least one physical property of a semiconductor device, the semiconductor device including a power on reset circuit, the power on reset circuit comprising:
a first linear feedback shift register;
a second linear feedback shift register,
wherein the first linear feedback shift register is configured to operate at least partially in parallel with the second linear feedback shift register;
a first stage output circuit configure to assert a first stage completion signal in response to a first state of the first linear feedback shift register matching a first predetermined value and a second state of the second linear feedback shift register matching a second predetermined value;
a power on reset signal generation circuit configured to assert a variable length power on reset signal in response to a power-up event and to de-assert the variable length power on reset signal based at least in part on the completion signal; and
transforming the design information to comply with a file format; and generating a data including the transformed design information.

40. The method of claim 39, wherein the data file has a GDSII format.

41. A method comprising:
receiving a data file including design information corresponding to a semiconductor device; and
fabricating the semiconductor device according to the design information,
wherein the semiconductor device includes a power on reset circuit, the power on reset circuit comprising:
a first linear feedback shift register;
a second linear feedback shift register,
wherein the first linear feedback shift register is configured to operate at least partially in parallel with the second linear feedback shift register;
a first stage output circuit configured to assert a first stage completion signal in response to a first state of the first linear feedback shift register matching a first predetermined value and a second state of the second linear feedback shift register matching a second predetermined value; and a power on reset signal generation circuit configured to assert a variable length power on reset signal in response to a power-up event and to de-assert the variable length power on reset signal based at least in part on the completion signal.

42. The method of claim 41, wherein the data file has a GDSII format.

* * * * *